United States Patent [19]

Klemes

[11] Patent Number: 4,931,977
[45] Date of Patent: Jun. 5, 1990

[54] VECTORIAL ADAPTIVE FILTERING APPARATUS WITH CONVERGENCE RATE INDEPENDENT OF SIGNAL PARAMETERS

[75] Inventor: Marek Klemes, Napean, Canada

[73] Assignee: Canadian Marconi Company, Montreal, Canada

[21] Appl. No.: 268,750

[22] Filed: Nov. 8, 1988

Related U.S. Application Data

[63] Continuation-in-part of Ser. No. 115,246, Oct. 30, 1987, abandoned, which is a continuation-in-part of Ser. No. 782,551, Oct. 1, 1985, now abandoned.

[51] Int. Cl.$^5$ ............................ G06G 7/12; H03B 3/02
[52] U.S. Cl. ............................. 364/581; 364/571.02; 342/378
[58] Field of Search ............... 364/572, 573, 581, 582, 364/571.01, 571.02, 571.06; 343/380–382; 342/378, 380, 382, 383

[56] References Cited

U.S. PATENT DOCUMENTS

| 4,136,314 | 1/1979 | Blackmer et al. | 364/581 |
| 4,509,132 | 4/1985 | Kavaya | 364/571.02 |
| 4,719,581 | 1/1988 | Sakamoto et al. | 364/571.01 |

FOREIGN PATENT DOCUMENTS 57-062468  4/1982  Japan ................................... 364/581

OTHER PUBLICATIONS

Compton, Jr., "Improved Feedback Loop for Adaptive Arrays", IEEE Transactions on Aerospace, vol. AES-16, No. 2, Mar. 1980, pp. 159–168.

Gabriel, "Adaptive Arrays-An Introduction", Proceedings of the IEEE, vol. 64, No. 2, Feb. 1976, pp. 239–272.

Primary Examiner—Parshotam S. Lall
Assistant Examiner—Brian M. Mattson
Attorney, Agent, or Firm—Fishman, Dionne & Cantor

[57] ABSTRACT

An adaptive signal processor, used for discriminating between a desired signal and several undesired signals, includes an arrangement of sensors, which samples the signals and forms a set of parallel electrical outputs each of which is proportional to a different linear combination of the desired and interfering signals, a set of complex weights, each of which multiplies a corresponding one of the electrical outputs thus forming a set of weighted signals, a coherent summing junction which coherently sums the weighted signals, thus producing a final output of the processor and a set of improved control loops which sample the parallel electrical outputs and the final output and generate from them a set of control signals to control the complex weights so as to drive them to optimal, steady states, and thereby to suppress the interfering signals and to preserve the desired signal at the final output of the processor. The control loops generate the control signals for the weights in such a way that the weights converge to their optimal steady states always in a fixed, predetermined and optimal amount of time which is independent of all parameters of the desired and interfering signals.

37 Claims, 9 Drawing Sheets

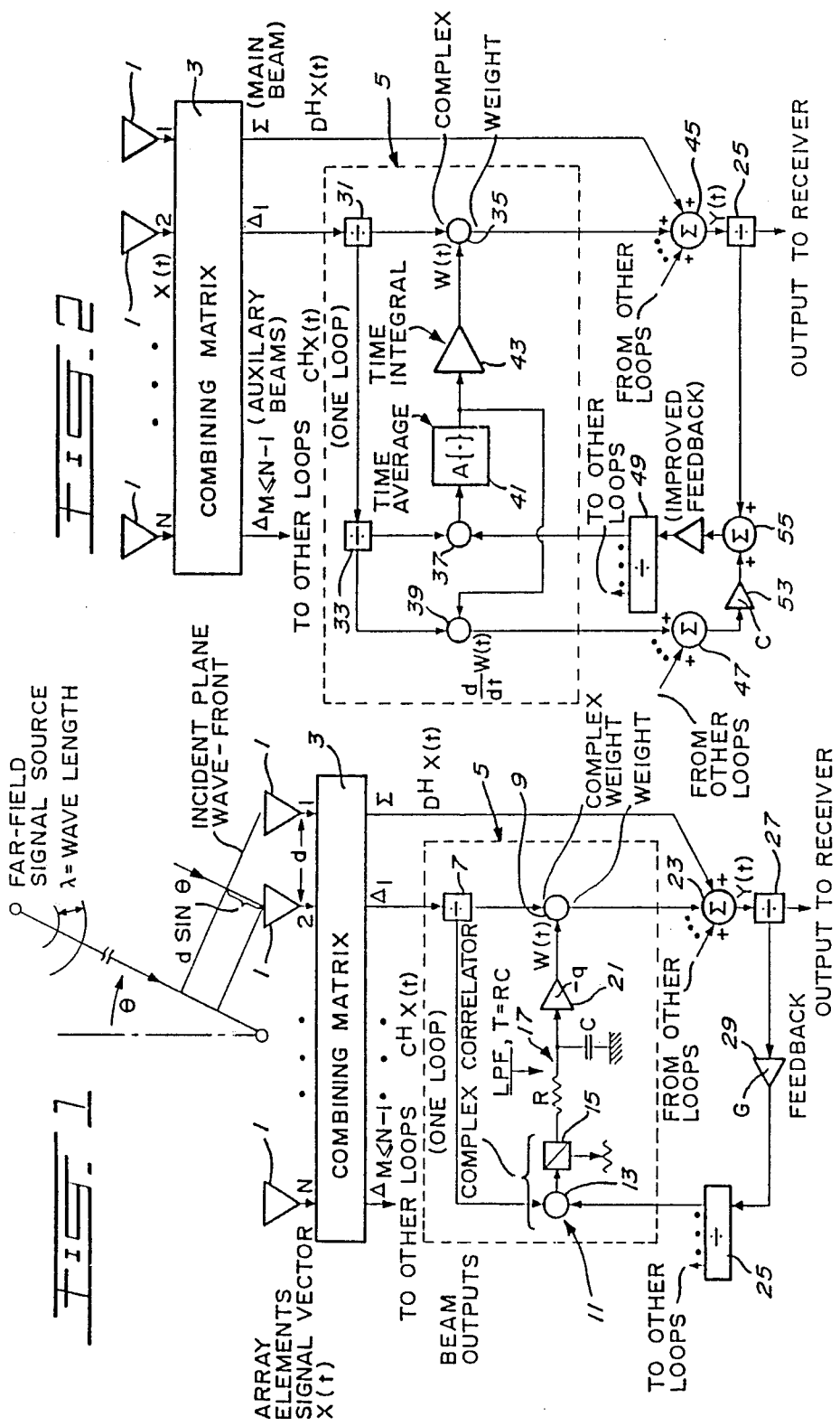

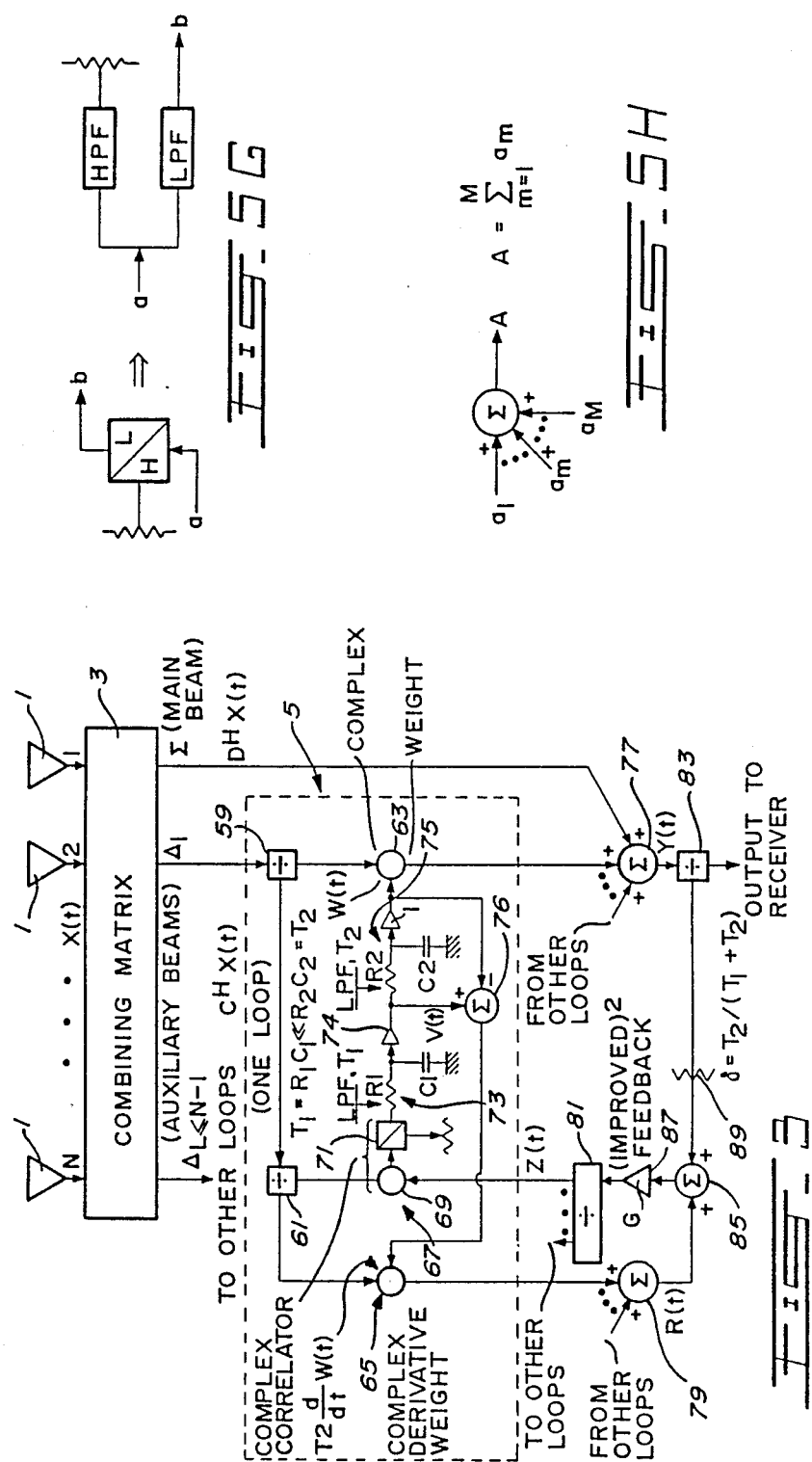

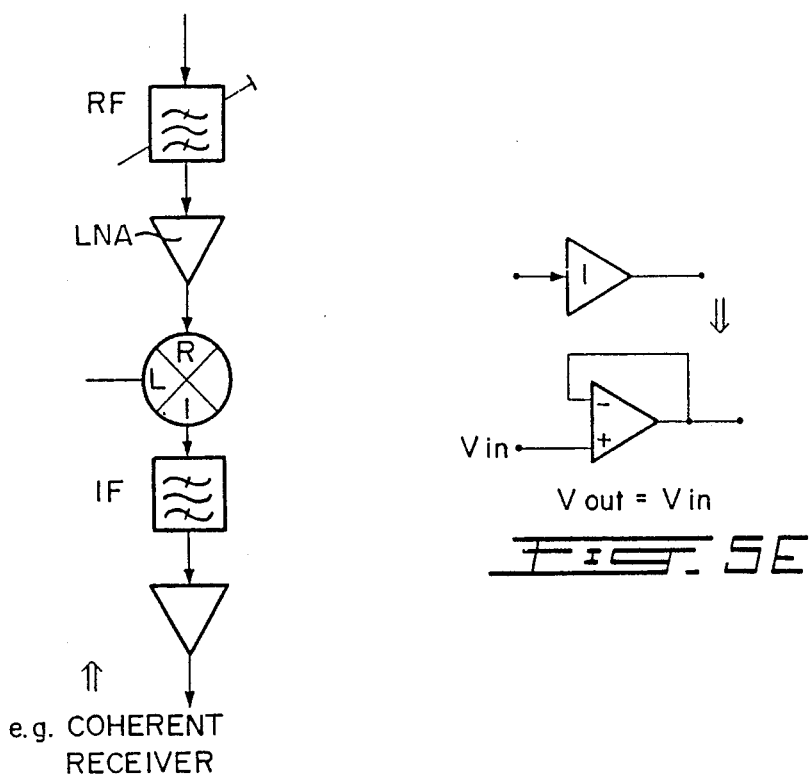
e.g. COHERENT RECEIVER
Fig. 5A
Fig. 5E
$V_{out} = V_{in}$
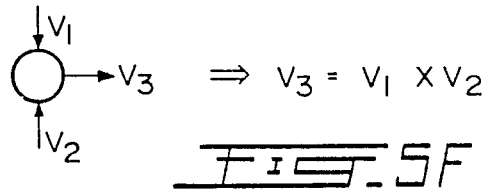
$\Rightarrow V_3 = V_1 \times V_2$
Fig. 5F
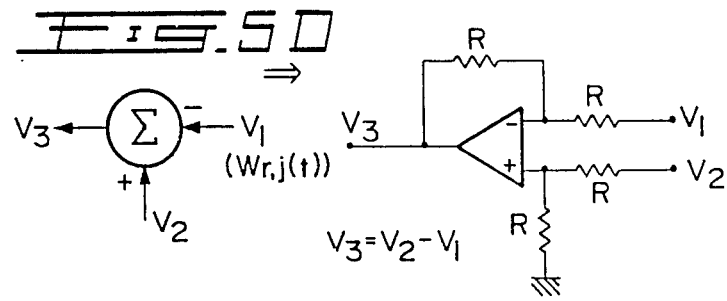
Fig. 5D
$V_3 = V_2 - V_1$

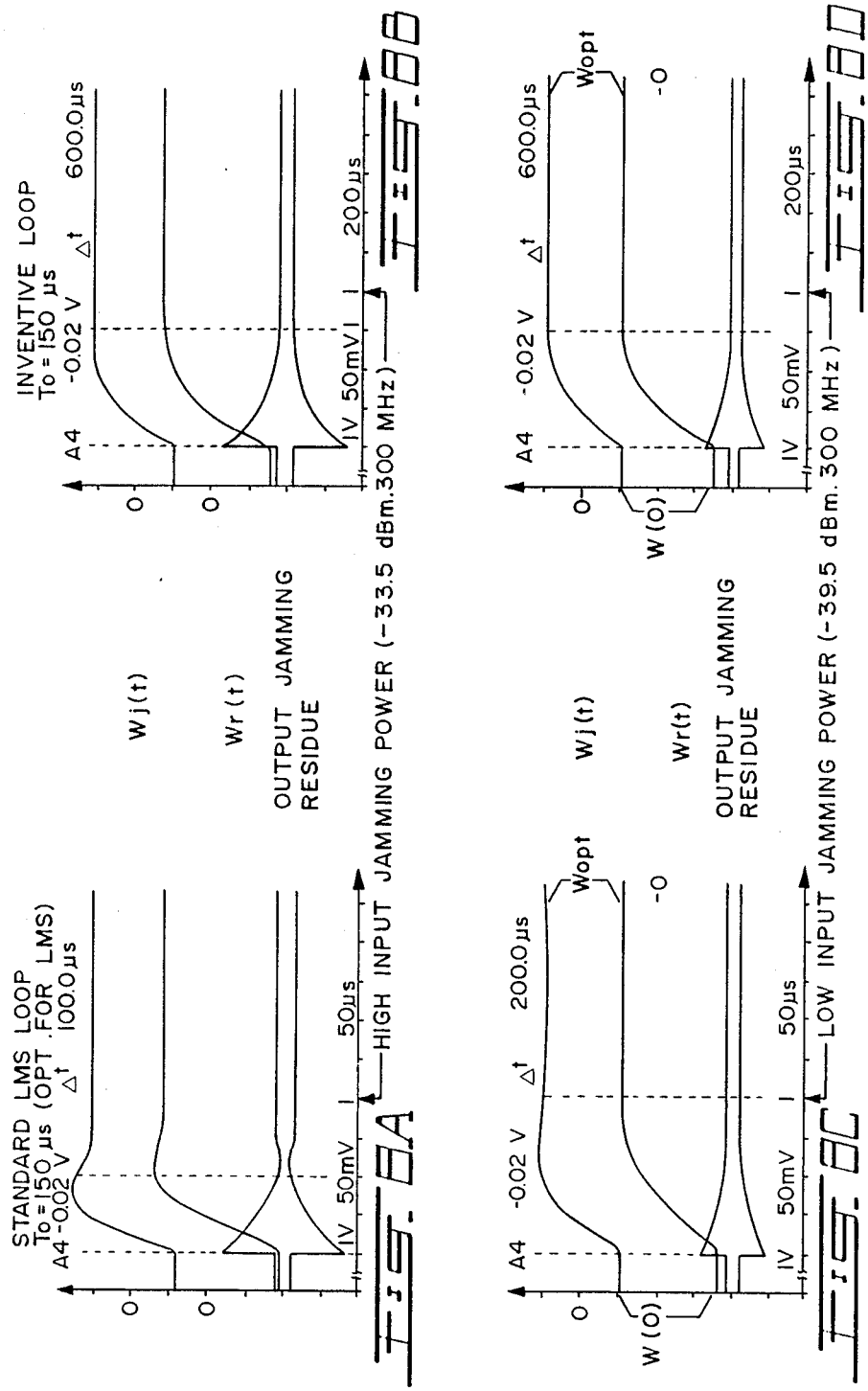

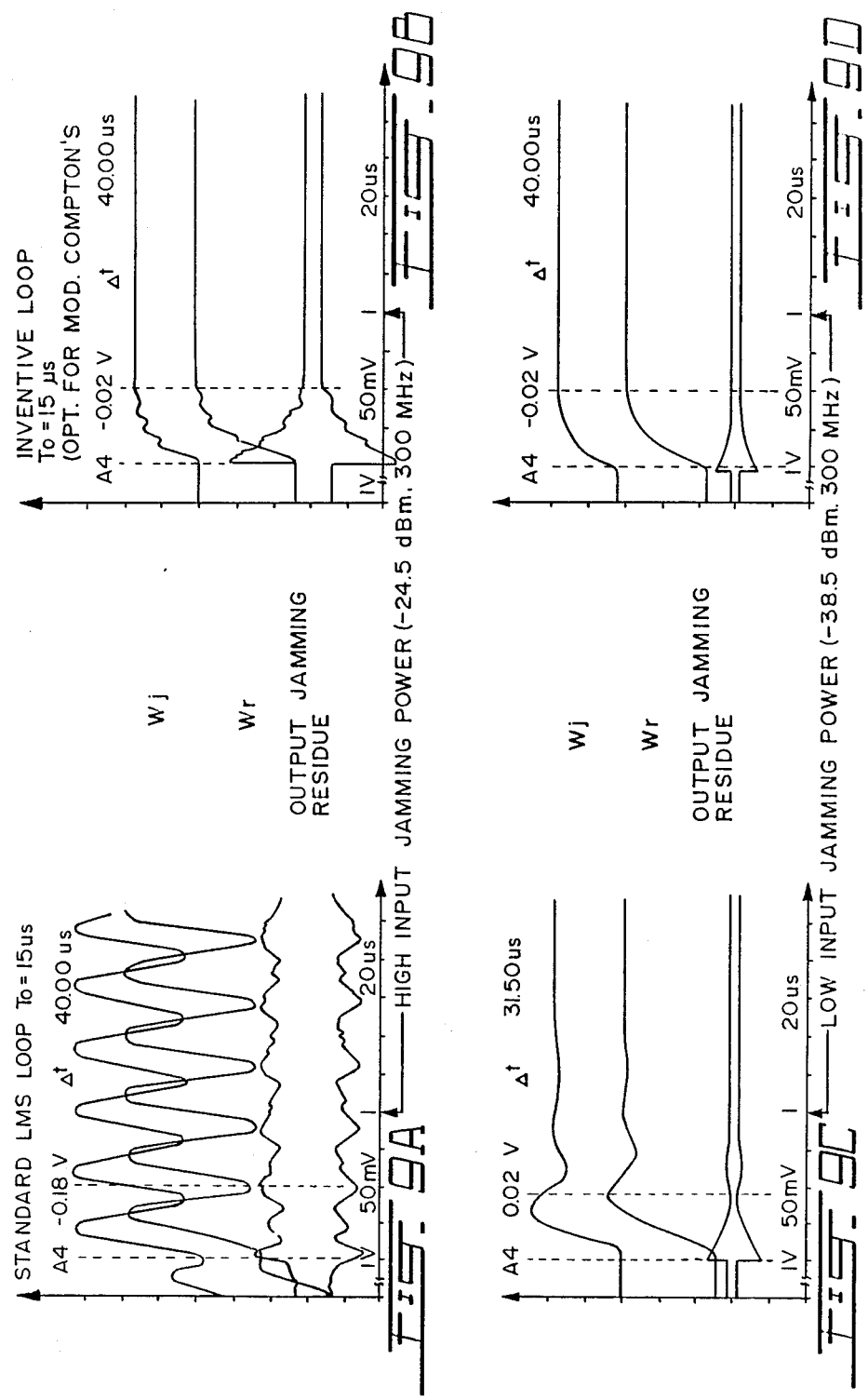

VECTORIAL ADAPTIVE FILTERING APPARATUS WITH CONVERGENCE RATE INDEPENDENT OF SIGNAL PARAMETERS

CROSS-REFERENCE TO RELATED APPLICATION

This application is a continuation-in-part of continuation-in-part application Ser. No. 115,246 filed 10-30-87, now abandoned, which is a continuation-in-part of parent application Ser. No. 782,551, filed 10-1-85 now abandoned.

The invention relates to a novel adaptive signal processor for use with a sensor array arrangement which senses both desired and interference signals. More specifically, the invention relates to such an adaptive signal processor which causes constant convergence of weights which reduce the intensity of the interference signals, while preserving the desired signal, independently of signal environment.

For clarity, the present invention is described with respect to antenna arrays comprising the sensor array arrangement. However, it does have applications in other contexts. Thus, it is applicable in LMS (Least-Mean-Squares) type adaptive echo-cancellers, adaptive noise-cancellers, adaptive tapped-delay-line filters and equalizers, and adaptive transducer arrays (e.g. sonar).

An adaptive signal processor for an antenna array strives to minimize the mean square value of a performance function, such as its output signal, or an error signal, which is equivalent to minimizing the power of interference signals at its output which it passes to a receiving modem. This operation translates into the formation of spatial nulls in the directions of independent sources of interference signals, in the angular gain pattern of the antenna array. At the same time, a high gain is maintained in the angular direction of the source of the desired signal.

One such processor is described in Gabriel W. F.: "Adaptive Arrays—An Introduction", Proceedings of the IEEE Vol. 64, No. 2, Feb. 1976.

This process of adaptive least-mean-squares minimization described in Gabriel converges to the optimal weight-vector solution at a temporal rate which in the standard LMS algorithms is a functoin of a hardware time-constants of filters, feedback gain and of signal parameters which in turn depend on the nature of the signals, the relative powers and locations of their sources and the nature of the propagation environment. An algorithm (mathematical law) govers the adaptive adjustment, of convergence, of the complex weights (in-phase or "real" and quadrature-phase or "imaginary" multiplicative factors applied to the antenna output signals to change their phases and amplitudes) in time, as the signal scenario changes.

In the steady state it results in a vector of complex weights which change the phases and amplitudes of the antenna element output signals (each of which consists of a combination of desired and interference signals incident on the element) so that when these weighted signals are coherently combined in a summing node, the interference signals will subtract out among all the element outputs, leaving only the desired signal at the output of the summing node. This then is the output of the adaptive signal processor which is passed on to a receiving modem.

In standard LMS algorithms, and in systems employing such algorithms, it is often the case that the signal parameters and geometry of the distribution of the signal sources so affect the convergence rates of the weights that they converge to their optimal steady-state values in combinations of exponential modes, some of which have very small time-constants and others which have very large time-constants. The modes with very small time-constants cause the weights to be very noisy and to deviate substantially from their optimal values, whereas those with the very large time-constants cause the weights to converge so slowly to their optimal values that they allow too these modes of convergence have time-constants which are dependent on parameters of the overall signal scenario which varies unpredictably in time, the overall convergence rate of the algorithm is substantially beyond the control of the designer of a standard LMS adaptive array antenna.

The present invention is a new type of algorithm and system which converges according to time-constants which are all identical, totally determined by controllable hardware parameters and completely independent of the signal scenario parameters under all conditions. Thus the adaptive signal processor herein adjusts the weights to their optimal values in a predictable interval of time in any situation, and their optimal steady states are the same optimal weights arrived at by the standard LMS algorithm (or any other algorithm optimizing the same performance function).

The present algorithm behaves mathematically according to Newton's method for finding the (unique) zero of the gradient of the (positive real quadratic) surface of the performance function of the weights. The standard LMS algorithm finds the zero of this gradient by causing the locus of the weight-vector to descend along the performance hyper-surface in the negative direction of its gradient (in weight-coordinate hyperspace) at a temporal rate proportional to the magnitude of the gradient. Its temporal rate becomes zero when it reaches the minimum point of this hyper-surface, where the gradient is zero; i.e. it stops the weight adaptation when the minimal output interference power is achieved. Beacause the gradient of the performance surface varies with the location on the surface and is at the mercy of the signal scenario parameters which define the surface, the algorithm convergence rate varies unpredictably as the signal scenario. However, seeking the zero of the surface gradient by Newton's method avoids descending the gradient and instead proceeds along a different path with a constant convergence rate independent of the shape of the surface and thereby independent of the signal scenario's parameters that define the shape.

Previous attempts at modifying the standard LMS loop to make the LMS algorithm's overall convergence rate independent of signal scenario, or constant, consist of, among other things, a controller to optimally adjust the LMS feedback gain so as to compensate for the change in the gradient of the surface along which the weights converge in such a way that the optimally-controlled gain makes the convergence rate constant (independent of gradient). In other words, the feedback gain is optimally controlled so as to compensate for the speed variations otherwise present in the LMS algorithm due to the gradient of the performance surface (U.S. Pat. No. 4,236,158, Daniel, Nov. 25, 1980).

Another attempt consists of changing the feedback signal itself by an additive term proportional to the time-derivative of the weight-vector (Compton Jr. R.

T.: "Improved Feedback Loop for Adaptive Arrays", IEEE Transactions on Aerospace and Electronic Systems, Vol. AES-16, No. 2, March 1980). This prior art embodiment causes the dependence of the time-constants on signal-scenario parameters to approximately cancel out in the algorithm, but only for the smallest time-constants. It relies on setting the gain parameter 'c' to select the appropriate range of smallest time-constants among which the signal-parameter dependence is to cancel. It also relies on an ideal integrator and an unspecified time-averager.

The embodiment of the present invention is similar to the above, but is quite different from both. It is a modification and an improvement of the latter (Compton's paper supra), and does not require a gain parameter like 'c', nor an ideal integrator, but achieves constant, uniform convergence rates independent of the signal scenario parameters and under all conditions. It effectively causes the dependence on signal-scenario parameters of the LMS time-constants to cancel among all of the time-constants, large and small, more exactly than does Compton's loop (Compton's paper supra). Thus, its convergence is more exactly according to Newton's method than that of Compton's loop.

The present invention pertains to an array of sensor elements (e.g. antennas, sonar transducers, delay-line taps), a combining network connected to the inputs of adaptively-controlled complex weighting circuits and to their associated control circuits, directly or via coherent receivers, the weighted output signals being coherently combined in a summing node where the interference signals among them subtract out leaving only the desired signal at the output of the summing node, which is partly coupled out and fed back to the weight-controlling circuits and partly fed on to the receiver modem The summing node output signal may be further combined with a main combiner output signal, or with a reference signal before being fed back to the weight-controlling circuits. The weight-controlling circuits adjust the complex-weighting circuits in accordance with the following equation:

$$T_1 \frac{d^2W}{dt^2} + [(1 + T_1/T_2)I + fC^H X X^H C] \frac{dW}{dt} + \frac{1}{T_2} [I + \delta f C^H X X^H C] W = \frac{2\delta}{T_2} C^H X X^H D$$

where
W is the vector of complex weighting coefficients being adjusted;
X is the composite vector of all signals incident at the sensor elements, all having a passband width of B (Hz) at the coherent receiver outputs;
$T_1$ is a time-constant determined by hardware ($T_1 = R_1 C_1$ with $R_1$ a resistor, $C_1$ a capacitor), such that $T_1 > 2N/B$, N being the number of sensor elements and B defined as above;
$T_2$ is also a time-constant determined by hardware such that $T_2 >> T_1$, (e.g. $T_2 = 5T_1$ suffices);
f is a product of hardware parameters such as loop gains, losses, phaseshifts;
D is a vector of coefficients defining the formation of the main output of the combining matrix;
C is a matrix of coefficients, defining the formation of the auxiliary outputs of the combining matrix;
$\delta$ is a trimmable attenuator nominally set to a voltage-attenuation coefficient of $\delta = T_2/(T_1 + T_2)$;
I is the identity matrix
and superscript H denotes the complex conjugate transpose.

The above equation is accurately approximated by a first-order equation (after justifiable time-averaging) as $$\frac{dW}{dt} = -\frac{1}{T_2} [I/gG + M]^{-1} ([I/gG + M]W + S)$$

where
$M = C^H R C$, $R = \overline{XX^H}$ with the overbar denoting a time-average;
$S = 2C^H R D$ and
gG being the corresponding term of f above, namely feedback gain, loop gain, losses and phaseshifts.

It should be noted that S can be a constant offset-voltage vector added directly to W at the weighter-control input terminals, or it can be a vector resulting from the correlation of a scalar reference-signal-a(t) (substituted for the main combiner output $D^H X(t)$) and the auxiliary combiner output signal vector, $C^H X(t)$, as $S = \overline{C^H X(t) a^H(t)}$, depending upon the embodiment of the present invention.

The above equation is more easily solved and gives the behavior of the complex weighting vector explicitly as $$W(t) = (1 - e^{-t/T_2})[I/gG + M]^{-1} S + W(O) e^{-t/T_2}.$$

The nature of the sensing elements, the combining network for their output signals, the coherent receivers for the combiner outputs, the reference signal, depend on the embodiment of the present invention and do not form a portion of the present invention. As such, they will not be discussed in detail in this disclosure and it will be assumed that they are included as other components of the system which employs the said invention.

It is an object of the present invention to provide a new and improved adaptive signal processor for producing uniform, constant and completely predictable and stable convergence of the complex weights comprising the weight-vector W(t) under all conditions of the single scenario being sensed.

It is a further object of the present invention to provide a method of constant, uniform and completely predictable and stable convergence of the weights comprising the weight-vector, W(t), in an adaptive signal processor.

It is still a further object of the present invention to incorporate the Newton-method descent algorithm as a modification and improvement of Compton's apparatus (Compton's paper supra) so as to guarantee constant, uniform and completely predictable and stable convergence of the variable weights comprising the weight vector W(t) which minimizes interference signals in an adaptive signal processor under all its operating conditions.

In accordance with the invention, there is provided an adaptive signal processor which receives outputs from each of a plurality of sensor elements. The processor comprises a plurality of loops equal to or less than the number of elements in the array. The signal from each element is combined linearly with signals from other elements in the combining matrix and processed by a different one of the loops, and the outputs of the loops are fed to a summer circuit. Also fed to the summer circuit is the output from the extra combining-matrix output port referred to as the Σ-beam signal.

Each loop effects the adaptive weight controlling signal with a constant stable convergence rate.

The invention will be better understood by an examination of the following description, together with the accompanying drawings, in which:

FIG. 1 is a functional diagram of an embodiment of an adaptive signal processor applying a standard LMS algorithm in accordance with the teachings of Gabriel;

FIG. 2 is a functional diagram of an embodiment of the feedback loop as taught in Compton;

FIG. 3 is a first embodiment of an adaptive signal processor in accordance with the invention herein;

The diagrams in FIGS. 1 to 3 are appropriate for a complex-number mathematical description which is used throughout this disclosure.

Figure 4:
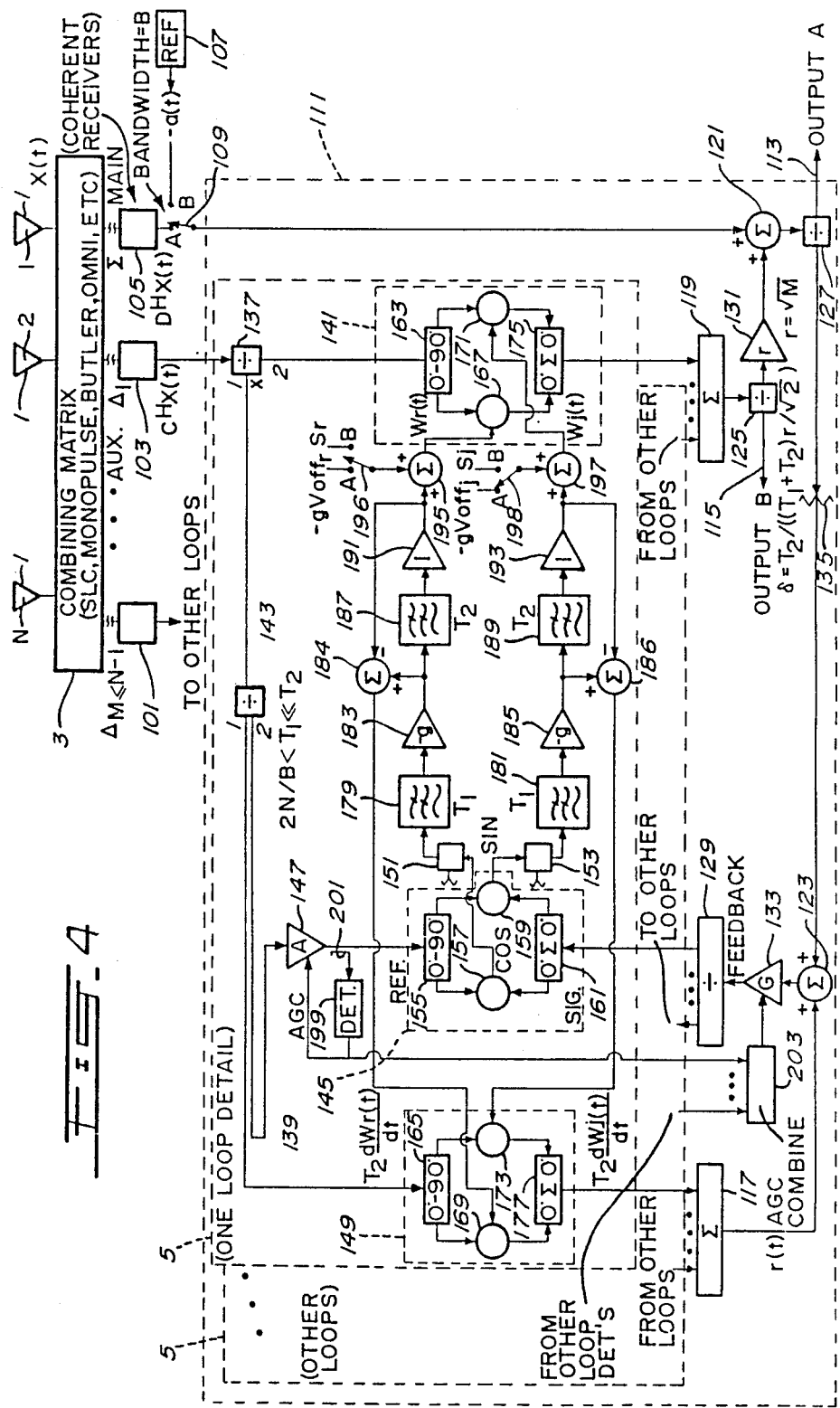
Figure 5B:
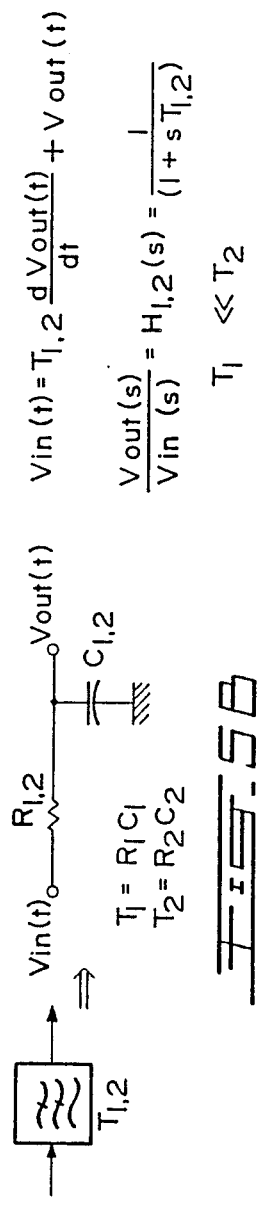
Figure 5C:
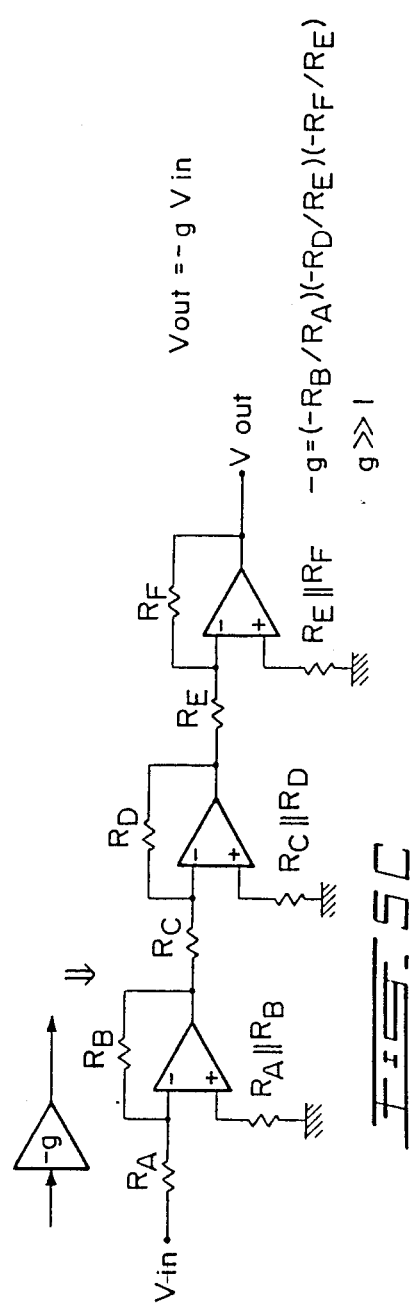

FIG. 4 illustrates a preferred embodiment of the present invention showing explicitly the signal and signal-processing elements appropriate for an equivalent real-number mathematical description and for physical realization of the system.

Figure 6:
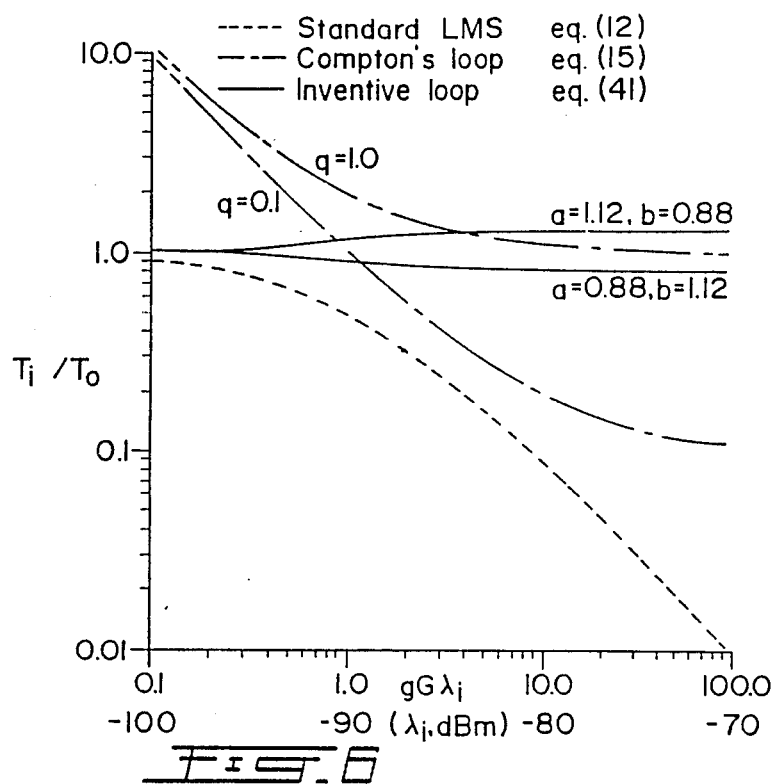
Figure 7:
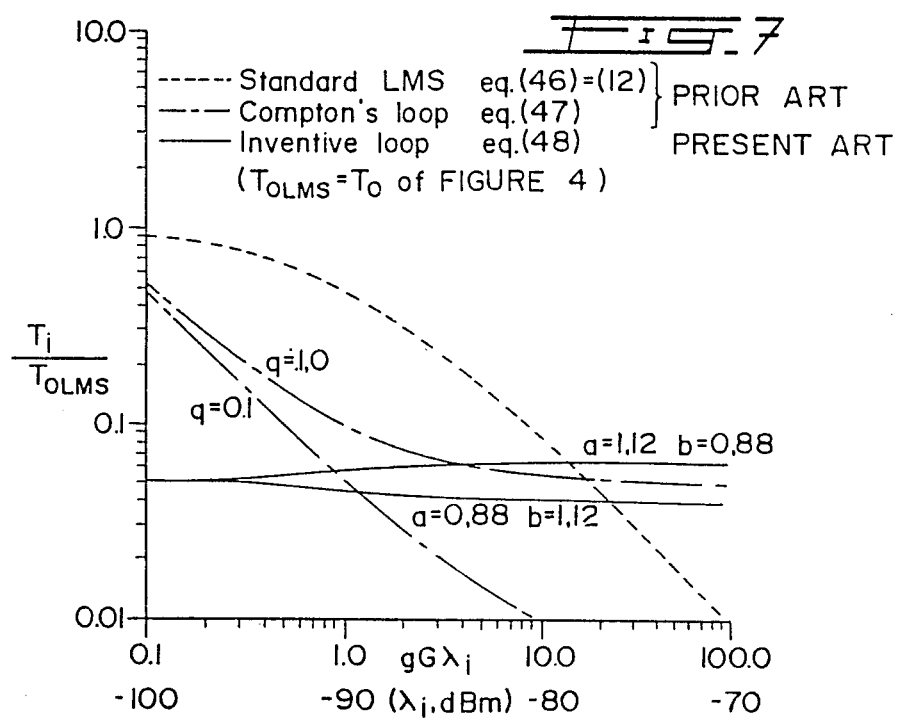
Figure 10A:
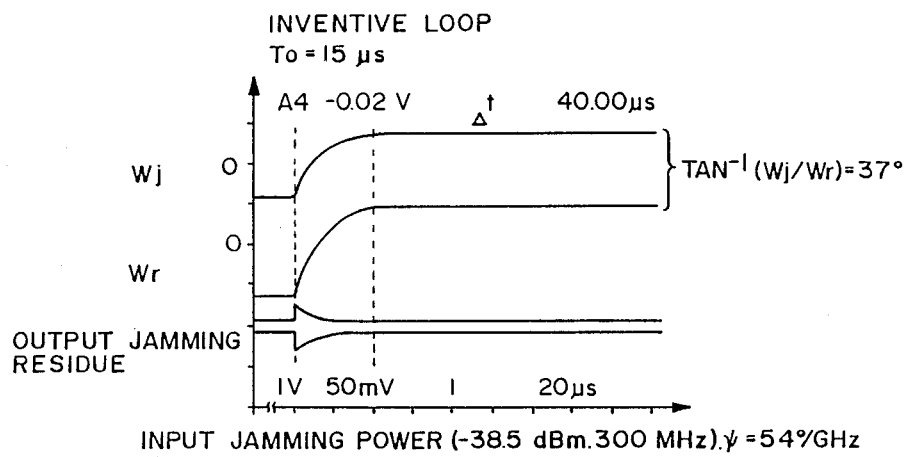
Figure 10B:
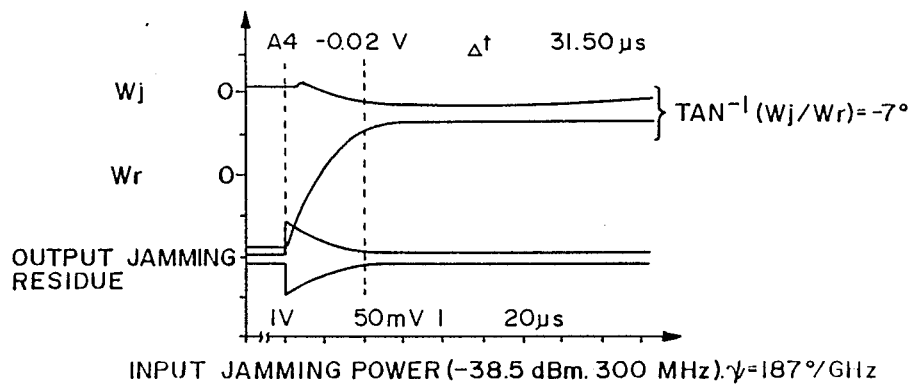

FIGS. 5A to 5H are explanatory diagrams to explain some of the symbols used in FIGS. 1 to 4;

FIG. 6 is a comparison of the convergence properties, namely, of closed loop time constants $T_i$, as functions of signal scenario parameters, $\lambda_i$, of the arrangements illustrated in FIGS. 1, 2 and 3 when they possess the same open loop time constant $T_O$;

FIG. 7 is a comparison of the convergence properties, namely, of closed loop time constants, $T_i$, as functions of signal scenario parameters, $\lambda_i$, of the arrangements illustrated in FIGS. 1, 2 and 3 when they possess open loop time constants that are individually optimized for each arrangement;

FIGS. 8a to 8d compare the experimental convergence rate of the step response of the present arrangement versus the convergence rate of the step response of the arrangement illustrated in FIG. 1 with both arrangements having TO optimized for the arrangement illustrated in FIG. 1;

FIGS. 9a–9d compare the experimental convergence rate of the step responses of the arrangement of FIG. 1 with the convergence rate of the step responses of the present arrangements as in FIGS. 8a to 8d, but with both arrangements having TO optimized for the present arrangement illustrated in FIG. 3;

FIGS. 10a and 10b are illustrations of experimental results showing the change in optimal weights generated by the present arrangement under the two different relative phases of its main and auxiliary input signals.

Similar reference numerals in different figures relate to the same elements in these figures.

The physical structures illustrated in FIGS. 1, 2 and 3 will first be described, and the structural description will be followed by a mathematical analysis of the circuit operation.

Referring to FIG. 1, a plurality of antenna elements 1, consisting of N elements not necessarily all identical, are connected to a combining matrix 3. The combining matrix 3 has a plurality of outputs $\Delta 1, \ldots \Delta M$, where N is less than or equal to $N-1$.

The structure of a combining matrix 3 is well known in the art; (examples are illustrated in Robert A. Monzingo and Thomas W. Miller.: *Introduction to Adaptive Arrays*, (John Wiley Interscience Publication, John Wiley and Sons 1980).

Hudson, J. E.: *Adaptive Array Principles*, (IEEE Electromagnetic Waves Series, 11, Peter Peregrinus on behalf of IEEE, U.K. 1981).

Mayhan, J. T. "Adaptive Nulling with Multi-Beam Antennas", Trans. Antennas and Propag., Vol. AP-26, No. 2, March 1978.

For Example, the combining matrix may be nothing more than a straight through connection connecting, for example, element N to output $\Delta M$, element $N-1$ to element $\Delta M-1 \ldots$ and antenna element 2 to output $\Delta 1$. One output port of the combining matrix 3 is designated as the main $\Sigma$-beam and forms the output $\Sigma$ of the combining matrix 3. The remainder of the output ports are designated auxiliary beams.

The adaptive signal processor comprises a plurality of M loops 5, and each loop is connected to a different output $\Delta 1$–$\Delta M$. Each loop includes a 2-way 0 degree power divider 7, and one output of the power divider 7 is fed to a complex weighter 9 comprising, in the FIG. 1 embodiment, a multiplier element explained in FIG. 5F hereof. The other output of the divider 7 is fed to a complex correlator 11 comprising a multiplier 13 and a diplex filter 15. The diplex filter is explained in FIG. 5G hereof.

The output of the diplex filter arrangement comprises an RC filter 17 having a time constant T. The output of the filter 17 is fed to an amplifier 21 having a gain $-g$, (see FIG. 5c) and the output of the amplifier 21 is in turn fed to a second input of the complex weighter 9.

All of the loops are closed by a summer node 23 (see FIG. 5H) which, as can be seen, receives inputs from all of the loops, as well as from terminal $\Sigma$ of combining matrix 3, and a power divider node which, as can be seen, provides output to all of the loops. The output of the summer 23 is fed to a power divider 27, and the dividers 25 and 27 are connected by an amplifier 29 having a gain G.

Referring now to FIG. 2, each loop as disclosed by Compton comprises power divider 31 having one output thereof connected to the input of a second power divider 33. The other output of 31 is fed to complex weighter 35 which, once again, comprises a multiplier element.

One output of divider 33 is connected to one input of multiplier element 37, and the other output of divider 33 is connected to one input of multiplier element 39. The output of 37 is fed to a time averager 41, and the output of the time averager 41 is fed to integrator 43. The output of the integrator 43 is connected to the second input of the multiplier 35.

The output of time averager 41 is also fed to the second input of multiplier 39.

The loops in FIG. 2 are closed by summer 45 and summer 47 as well as power divider 49. As can be seen, summer 45 receives input from each loop as well as from the $\Sigma$-beam, and summer 47 receives input from only the loops. Divider 49 provides output to each of the loops.

The output of summer 45 is fed to power divider 51, and the output of summer 47 is fed to amplifier 53 which has a gain C. One output of divider 51 is fed to summer 55 whose other input is fed from the output of amplifier 53. The output of summer 55 is connected to amplifier 57 whose output is connected to the power divider 49.

The other output of divider 51 is the output of the processor which is connected to the receiving modem input.

Turning now to FIG. 3, each loop in accordance with the present invention comprises a power divider 59 having one output fed to a power divider 61. The second output of divider 59 is fed to a complex weighter 63 which, in the FIG. 3 embodiment, comprises a multiplier element.

One output of divider 61 is fed to complex weighter 65 which, again, comprises a multiplier element, and the other output of divider 61 is fed to a complex correlator illustrated generally at 67. The complex correlator 67 comprises a multiplier element 69 and a diplex filter 71.

The output of the diplex filter is fed to a filter arrangement 73 which is an RC filter having a time constant $T_1 = R_1 C_1$. The output of the filter arrangement 73 is connected to the input of amplifier 74 having gain $-g$, and the output of amplifier 74 to filter arrangement 75 which is also an RC filter and has a time constant $T_2 = R_2 C_2$ such that $T_2 >> T_1$.

The output of filter 73 is also connected to subtractor 76 (see FIG. 5D) whose second (i.e. inverting) input is connected to the output of filter 75. The output of summer 76 is fed to a second input of complex weighter 65.

The loops in FIG. 3 are closed by summer 77 which, as can be seen, receives input from all of the loops as well as from the Σ-beam output port, and a summer 79 which receives input only from all of the loops. The loops are also closed by power divider 81 which provides output to all of the loops.

The output of summer 77 is fed to one input of power divider 83, and one output of divider 83 is fed to one input of summer 85 whose other input is connected to the output of summer 79. The output of summer 85 is connected to amplifier 87, which has a gain of G and the output of amplifier 87 is fed to the input of power divider 81.

Attenuator 89 is inserted between the output of divider 83 and the input of summer 85.

The other output of divider 83 is the output of the processor and is connected to an input of the receiving modem.

FIG. 1 shows the basic 'standard' LMS adaptive loop in the context of a sidelobe-canceller array. The following discussion will use the sidelobe-canceller as an example but it can easily be extended to other types of adaptive arrays such as the Howells-Applebaum, Widrow and power-inversion configurations. We represent the M signals arriving at the N elements in FIG. 1 by the complex N-vector $$X(t) = \sum_{i=1}^{M} m_i(t) e^{j\omega_i t} S(\theta_i) \quad (1)$$

where
- $m_i(t)$ is the complex envelope of the signal arriving from the i-th source in the far field;
- $\omega_i$ is its radian carrier frequency $S(\theta_i) = [1, e^{-j\phi_i}, \ldots, e^{-j(N-1)\phi_i}]^T$ is the vector of relative phases of the i-th signal at the elements with $\phi_i = 2\pi d \sin(\theta_i)/\lambda_i$, for a linear uniform array of identical omni-directional antenna elements (in general the array can have arbitrary geometry);
- $\theta_i$ is the (azimuth) bearing of the i-th source.

We assume that all signals are relatively narrowband so that $$m_i(t) = m_i(t - \tau_i) \text{ for } n = 1, \ldots N-1$$

with $\tau_i = d \sin(\theta_i)/c$ being the inter-element transit time of the incoming planewave from the source in direction $\theta_i$. The signals are assumed to be mutually uncorrelated so that $$\epsilon(m_i(t)e^{j\omega_i t})(m_j(t)e^{j\omega_j t})^* = \delta_{ij} p$$

where ()* denotes the complex conjugate, p the average signal power, $\delta_{ij}$ is the Kronecker delta and $\epsilon$ denotes expectation, which is replaced by a time-average because the signals are also assumed to be ergodic.

The beamformer simply denotes the fact that there exists a main beam pointed at the desired signal and auxiliary beams having a low, nearly omnidirectional gain coverage. These can be formed from an array using a combining network which combines signals into the main ('Σ') beam according to $$\Sigma(t) = D^H X(t) \quad (2)$$

and into (up to N−1) auxiliary beams as $$\Delta_n(t) = C_n^H X(t) \quad (3)$$

where $()^H$ denotes the complex-conjugate transpose, D is a vector of pre-weighting coefficients corresponding to the aperture taper and phasing for the main beam, and each $C_n$ is a similar vector for forming the n-th auxiliary beam. It is a good idea to make $D_n^H C = 0$ for all n so as not to suppress the desired signal. (This becomes a power-inversion array if we make $$D = [1, 0, \ldots 0]^T$$

and $$C^H = \begin{bmatrix} 0 & 1 & 0 & \ldots & 0 \\ 0 & 0 & 1 & \ldots & 0 \\ \ldots & & & & \\ 0 & \ldots & & 0 & 1 \end{bmatrix}$$

the rows of the (N−1)XN matrix $C^H$ being the N−1 row vectors $C_n^H$. It becomes a Widrow-type array if we substitute a reference signal for the main-beam signal $-\Sigma(t)$). The output of the adaptive array is the weighted sum of the auxiliary signals and the constrained main-beam signal, written as the sum of complex vector inner products $$y(t) = D^H X(t) + W^H(t)[C^H X(t)] \quad (4)$$

where W is the vector of complex adaptive weighing coefficients. The average output power is given by $$\overline{|y(t)|^2} = \overline{y(t)y^*(t)} = D^H R D + W^H C^H R D + \quad (5)$$

$$D^H R C W + W^H C^H R C W$$

where $R = \overline{X(t)X^H(t)}$ is the signal covariance matrix and W(t) is assumed to be independent of X(t) in performing the time-averages denoted by the overbars. The standard LMS algorithm strives to minimize (5) by making the weights follow its negative gradient to zero with respect to the weights as $$\frac{dW(t)}{dt} = -\mu \nabla_w \overline{|y(t)|^2} = -2\mu(C^H R D + C^H R C W) \to 0 \quad (6)$$

and when that unique point is reached in the steady state (dW/dt=0) the optimal weight vector that minimizes total average output power subject to the gain-constraint on the Σ-beam is given by $$W_{opt} = -(C^HRC)^{-1}C^HRD$$

Taking the effective weight for the constrained ('main or Σ-beam') channel to be unity, the complete optimal weighting vector for the array is $$W_o = \begin{bmatrix} 1 \\ \cdots \\ -M^{-1}S \end{bmatrix} \quad (7)$$

where $M = C^HRC$ is different from 'M' in (1) and $S = C^HRD$. This is equivalent to the classical Wiener-type solution for an adaptive array using $D = [1, 0, \ldots 0]^T$ as its steering vector. In the quiescent state when signal power is absent in matrix R, the weighting vector reduces to $W_q = D$.

In real-time, M and S are not available to compute a gradient with as in (6), so it is estimated by the correlator of the loop in FIG. 1 and used to control the weights as $$\frac{dW(t)}{dt} = -\mu \nabla_w \overline{|y(t)|^2} = -2\mu C^H X(t) y^*(t) \quad (8)$$

By substituting (4) for y(t) and solving the first-order RC lowpass filter in FIG. 1, we obtain the governing differential equation for the weights as $$\frac{dW(t)}{dt} = \frac{-1}{T}[I + gGC^H X(t)X^H(t)C]W(t) - \quad (9)$$

$$\frac{gG}{T}[C^H X(t)X^H(t)D]$$

which can be solved completely by variation of parameters as $$W(t) = -\frac{gG}{T} \int_0^t \exp\left[-\frac{1}{T} \int_\tau^t (I + gGC^H X(\xi)X^H(\xi)C)d\xi\right] C^H X(\tau)X^H(\tau)D d\tau + \quad (10)$$

$$\exp\left[-\frac{1}{T} \int_0^t (I + gGC^H X(l)X^H(l)C)dl\right] W(0).$$

Here T is the open-loop time-constant of the first-order LMS loop, T=RC; −g is the DC (negative) feedback gain and G is more feedback gain, in the RF feedback path To simplify the outcome the exponentials in (10) can be replaced by moving time-averages according to $$\frac{1}{T} \int_\tau^t (I + gGC^H X(\xi)X^H(\xi)C)d\xi \rightarrow$$

$$\frac{-(t-\tau)}{T}(I + gGC^HRC)$$

and $C^H X(\tau)X^H(\tau)D$ can also be approximated by its average value $C^HRD$. The average weighting vector is then seen to converge as $$\overline{W}(t) = -gG(I - \exp[-t(I + gGM)/T])(I + gGM)^{-1}S + \quad (11)$$

$$\exp[-t(I + gGM)/T]W(0)$$

where $M = C^HRC$ and $S = C^HRD$ were used. It converges to $$W_{opt} = -[I/(gG) + M]^{-1}S \approx -M^{-1}S$$

The effect of the extra term 1/(gG) is equivalent to adding a small amount of thermal noise into the weighting channels if the feedback gains are large enough (it does not significantly affect the optimum state of the weights).

The time-constants of convergence are the main subject of interest in the present invention. They are obtained from the diagonalized averaged matrix coefficient of W(t) in (9), or by the corresponding factors in the exponents in (11). Matrix M is positive-definite Hermitian; it is diagonalized by the similarity transformation $$M = E\Lambda E^H$$

where Λ is the diagonal matrix of its (positive real) eigenvalues, E is the unitary transformation matrix ($E^H = E^{-1}$) whose columns are the corresponding orthonormal eigenvectors of M. The whole differential equation (average of (9)) can be cast in diagonal form by letting $K = E^HS$ and $L(t) = E^HW(t)$ so the entries, $l_i(t)$, of L(t) are the uncoupled modes of W(t). The modes of W(t) can be characterized each by a scalar equation from which the modal time-constants are obtained as $$T_i = T/(I + gG\lambda_i), \; i = 1, \ldots, N-1 \quad (12)$$

where T=RC is the open-loop time-constant, gG the total feedback gain and $\lambda_i$ is the i-th eigenvalue of M, corresponding to the i-th mode of W(t). The individual weights are each a linear combination of the modes, so each weight-controlling signal is a linear combination of exponentials having time-constants given by (12). The eigenvalues are in turn different linear combinations of signal powers in the N−1 auxiliary channels.

It is often the case that some $\lambda_i$ are very much larger than others, giving rise to modes that converge very much faster than other, very slow modes. The very fast modes make the weighting coefficients very jittery causing large variations in residual output power while the slow modes take so long to converge to the steady-state that the weights pass an intolerable amount of interference energy to the receiving modem before they settle to their optimal values. Such convergence-rate disparities in the standard LMS algorithm arise as a result of common situations, such as when the number of interference sources is less than the number of degrees of freedom (the large λ's are of the order of interference power while the smallest ones are of the order of noise power); when interference sources are closely spaced in angle and/or when they are partially correlated; when sources have widely different power levels and are separated by more than a beam width and when the nulling bandwidth is large and the transfer functions of the weighting channels are not well matched across the bandwidth. In most of these situations the eigenvalue disparities are determined by the signal environment and are thus beyond the designer's control. This problem has caused the popular LMS algorithm to lose favour with many designers seeking high-performance solutions, and has prompted others to conceive modifications and improvements of the algorithm.

The problem that is solved by the present invention is therefore that of eliminating the large uncontrollable disparities in the modal convergence rates that arise in the standard LMS-types of algorithms under various commonly-encountered conditions. This is done by a readily-realizable modification of the LMS-type feedback loop.

Considering FIG. 2, Compton originally conceived an improvement of the LMS-type feedback loop which makes its convergence rate almost independent of the the eigenvalues and consequently the signal environment. The diagram as shown in FIG. 2 is in the same sidelobe-canceller context as the 'standard' LMS loop of FIG. 1. It is a simple-looking modification (compared to orthogonalizing pre-processors proposed by others for the same purpose), but seems to have been overlooked in the public literature. The idea in FIG. 2 is to approximate a Newton-Raphson acceleration of the LMS algorithm by adding to the feedback signal the sum (multiplied by 'c') of the input signals weighted by the time-derivative of the weighting vector. The time-average, A{.}, is required to give a sufficiently close estimate of $C^H R C = C^H \overline{X(t) X^H(t)} C$ by performing the time-average as $C^H A\{X(t) X^H(t)\} C$ in the derivative feedback term, so as to permit the near-cancellation of eigenvalues of $C^H R C$ in the time-constants. The derivations are carried out in the Compton paper and will not be repeated here; the result is that the feedback loop of FIG. 2 modifies the governing differential equation for the loop of FIG. 1 as $$(I + 2kcM) \frac{dW(t)}{dt} = -2kMW(t) - 2kS \quad (13)$$

which can be compared to (6) with the correspondence of $\mu$, $C^H R C$, $C^H R D$ to k, M, S in (13), respectively. When (13) is rewritten as $$\frac{dW(t)}{dt} = -2k((I + 2kcM)^{-1}MW(t) + (I + 2kcM)^{-1}S)$$

it can be shown that the time-constants, being obtained from the eigenvalues of the coefficient of W(t) as before, are now given by $$T_i = (1 + 2kc\lambda_i)/(2k\lambda_i) \quad (14)$$

where the $\lambda_i$, $i = 1, \ldots, N-1$ are the eigenvalues of M. (The same optimal weights are obtained in the steady state when $dW/dt = 0$ in (13) as before, i.e. $W_{opt} = -M^{-1}S$ and the constrained weight is unity). The constant 2k can be written as a quotient of the integrator's open-loop time-constant, T, and feedback gain which we will call gG, as $2k = gG/T$. To make the units consistent, c will be written as a product of a gain factor, q, and the time-constant, T, as $c = qT$. The variations of c will then be performed by varying q, and the corresponding modal time-constants in terms of the open-loop integrator time-constant become $$T_i = T(1 + gGq\lambda_i)/(gG\lambda_i), \, i = 1, \ldots, N-1 \quad (15)$$

It can be seen that $T_i$ in (15) are a much weaker function of $\lambda_i$ than are the $T_i$ in (12), for large values of q such that $gGq\lambda_{min} >> 1$. When q is not adjusted to make this true for $\lambda_{min}$, a similar convergence-rate disparity as in the 'standard' LMS algorithm results for the slow modes. Therefore, to make this scheme effective under all conditions that result in poor LMS convergence, q has to be maintained large enough, which slows down the overall convergence rate of Compton's improved algorithm. Compton shows the improved uniform convergence in an example of a discrete-time simulation of a two-loop array, but it appears never to have been implemented in hardware. It is not known what happened to this approach, but we show below how it can be extended and improved, and at the same time made readily implementable in hardware without requiring adjustment of a parameter like q. It is also relatively insensitive to circuit imbalances. The new improvement of Compton's idea is effective under all conditions even for the very slow modes, and can be optimized so as to be only relatively little slower than the faster modes of the 'standard' LMS algorithm.

FIG. 3 shows the new adaptive loop in the same sidelobe-canceller configuration as the previous two Figures. It does not use a perfect integrator as Compton's loop does, but uses a single-pole RC lowpass filter with time-constant $T_2$. The time-averager of Compton's loop is replaced by a more concrete device, i.e. another single-pole RC lowpass filter with time-constant $T_1 << T_2$. A subtractor is incorporated in the loop to generate the time-derivative of the weight, and the adjustable parameter 'c' is absent in the new loop. The open-loop time-constants of this loop are $T_1$ and $T_2$, with $T_2$ dominant (it is really a first-order-dominant, second-order system). The loop gains are again the same, namely gG.

The following analysis shows how the new loop achieves its convergence improvement, which is also an improvement over Compton's original loop. The relation to Newton's method is explained in Appendix A. For clarity the time arguments of the complex vector quantities W(t), V(t), U(t), X(t), and complex scalars y(t), z(t) and r(t) in FIG. 3 will be omitted in the analysis. With reference to the Figure, $$V = T_2 \frac{dW}{dt} + W \quad (16)$$

so the output of the subtractor is $V - W = T_2 dW/dt$. Similarily, $$U = T_1 \frac{d}{dt}(-V/g) - V/g. \quad (17)$$

But we also know that $U = C^H X z^*$ and $Z^* = G(r^* + y^*)$ where $$r = T_2 \frac{(dW)}{dt} {}_H C^H X \quad (18)$$

$$y = D^H X + W^H C^H X \quad (19)$$

therefore $U$ can also be expressed by

-continued
$$U = GT_2C^H XX^H C \frac{dW}{dt} + GC^H XX^H CW + GC^H XX^H D \quad (20)$$

Substituting (16) into (17) gives $U$ as $$U = \frac{T_1}{g} \frac{d}{dt}\left(T_2 \frac{dW}{dt} + W\right) - \frac{1}{g}\left(T_2 \frac{dW}{dt} + W\right)$$

which, when substituted into (20) and rearranged, leads to the second order differential equation governing the weights $$\frac{d^2W}{dt^2} + \frac{1}{T_1}[(1 + T_1/T_2)I + gGC^H XX^H C] \frac{dW}{dt} + \quad (21)$$

$$\frac{1}{T_1 T_2} [I + gGC^H XX^H C] W = -\frac{gG}{T_1 T_2} C^H XX^H D$$

In order to solve this for $W$ we make $T_1 << T_2$ and resort to time-averaging the coefficients as before, so (21) becomes $$\frac{D^2 W}{dt^2} + \frac{1}{T_1}[I + gGM]\frac{dW}{dt} + \quad (22)$$

$$\frac{1}{T_1 T_2}[I + gGM]W = -\frac{gG}{T_1 T_2} S$$

which can be solved by Laplace transforms as follows: Denoting the Laplace transform by $W = W'$, the Laplace transform of (22) is $$s^2 W' + \frac{1}{T_1}[I + gGM]sW' + \quad (23)$$

$$\frac{1}{T_1 T_2}[I + gGM]W' = -\frac{gG}{T_1 T_2} S$$

which is cast into diagonal form using $M = E\Lambda E^H$, $L' = E^H W'$, $$K' = E^H S'(-gG/(T_1 T_2)) \text{ and premultiplying (23) by } E^H = E^{-1} \quad (24)$$

$$s^2 L' + \frac{1}{T_1}[I + gG\Lambda]sL' + \frac{1}{T_1 T_2}[I + gG\Lambda]L' = K'$$

(where the complex-frequency arguments of $W'(s)$, $L'(s)$ and $K'(s)$ have also been omitted for clarity). The i-th mode of the weight-controlling signals in the transform domain is therefore found as $$l'_i = H_i k'_i \quad (25)$$

where the complex-frequency transfer function, $H_i(s)$ is given by:

$$H_i(s) = 1/(s^2 + b_i s + c_i) \quad (26)$$

with $b_i = (1 + gG\lambda_i)/T_1$ and $c_i = b_i/T_2$. In the time-domain the modes are given by the convolution:

$$l_i = \int_0^t h_i(t - \tau) k_i(\tau) d\tau \quad (27)$$

where $h_i = \mathcal{L}^{-1} H_i$ is the impulse response and $k_i = \mathcal{L}^{-1} k'_i$ is effectively the input or forcing function. The poles of the transfer function (26), written as $H_i = A_i/(s - \gamma_{i1}) = B_i/(s - \gamma_{i2})$, are given by $$\gamma_{i2}^1 = -\left[\frac{1 + gG\lambda_i}{2T_1}\right]\left[1 \mp \sqrt{1 - \left[\frac{4T_1}{T_2(1 + gG\lambda_i)}\right]}\right] \quad (28)$$

and the coefficients are $A_i = 1/(\gamma_{i1} - \gamma_{i2}) = -B_i$. When these are substituted into (27) and the integral evaluated there results:

$$l_i = \frac{[(1 - e^{\gamma_{i2}t})/\gamma_{i2} - (1 - e^{\gamma_{i1}t})/\gamma_{i1}]}{\left[\frac{4}{T_2}\sqrt{\frac{1 + gG\lambda_i}{4T_1/T_2}}\sqrt{\left[\frac{1 + gG\lambda_i}{4T_1/T_2}\right] - 1}\right]} \quad (29)$$

where the initial-conditions term was omitted as it decays to zero for large enough t. In (29) the i-th mode has two components: $(1 - e^{\gamma_{i2}t})/\gamma_{i2}$ and $(1 - e^{\gamma_{i1}t})/\gamma_{i1}$. When we invoke the established condition that $(1 + gG\lambda_i) << 4T_1/T_2$ (since $T_1 >> T_2$) and use the approximation $\sqrt{1 - \delta} \approx 1 - \delta/2$ for $\delta << 1$ in (28) the poles and coefficients simplify to:

$$\gamma_{i1} \cong -1/T_2 \quad (30)$$

$$\gamma_{i2} \cong -(1 + gG\lambda_i)/T_1 + 1/T_2$$

$$A_i \cong ((1 + gG\lambda_i)/T_1)^{-1} = -B_i$$

The component with $\gamma_{i2}$ has a much smaller magnitude than the one with $\gamma_{i1}$ (since $|\gamma_{i2}| >> |\gamma_{i1}|$) with our established conditions), and it also decays much faster so it can be neglected in the expression for the mode response for most values of $t > 0$. The mode response (29) can then be adequately characterized by the dominant component as:

$$l_i \approx ((1 + gG\lambda_i)/T_1)^{-1} T_2 (1 - e^{-t/T_2}) k_i \quad (31)$$

It is always stable as long as $T_1 < T_2$ and will not oscillate because the square-root in (28) will always be real for all values of $\lambda_i$ ($\lambda_i > 0$ since M is positive definite Hermitian). From (31) it is clear that all the modal time-constants are given by $$T_i = T_2, i = 1, \ldots N-1 \quad (32)$$

(or $T_i = b_i/c_i$ from (26)) which means they are completely independent of $\lambda_i$ and thus unaffected by the signal environment. The necessary conditions are easily arranged in a hardware implementation since it is only required to make $R_1 C_1 << R_2 C_2$. (A factor of 5 is considered sufficient. The value of $R_1 C_1 = T_1$ for sufficient time-averaging is obtained similarly as the time-constant for A $\{.\}$ in Compton's paper; time-constant optimization is discussed later). This new algorithm gives the correct optimal weights in the steady state, as can be verified by letting $t \to \infty$ and transforming the modes of (31) in matrix form $$L = T_1 T_2 (I + gG\Lambda)^{-1} K$$

back to $$W_{opt} = -\left[\left[\frac{1}{gG}\right]I + M\right]^{-1} S \simeq -M^{-1}S$$

as before. Note that $T_2$ effectively replaces c so no adjustable parameter is required in our loop and it will equalize all modal time-constants automatically under all conditions. To substantiate our claim of practicality of this improved loop, it is shown next that the time-constants and the steady-state weights are robust with common circuit imbalances.

Before proceeding with this analysis we note that equation (21) can be adequately approximated by a first-order dominant, time-averaged equation by pre-multiplying it by $T_1$ and letting $T_1 d^2W/dt^2 \to 0$ when the time-average is taken. The same result is obtainable by modelling filter $\underline{R_1 C_1}$ by a simple time-average operation as $V(t) = -gU(t)$. The result is $$[I + gGM]\frac{dW}{dt} + \frac{1}{T_2}[I + gGM]W = -\frac{gG}{T_2} S \quad (33)$$

with $M = C^H \overline{XX^H} C$ and $S = C^H \overline{XX^H} D$ as before. The effect of circuit imbalances can be modelled by three complex diagonal matrices, J, F, and N, matrix N being different than N used to denote the number of elements, which account for the phase and amplitude imbalances suffered by the elements of $C^H X(t)$ as they travel between the ports in three separate paths leading from the input power divider (at top right corner of dashed box in FIG. 3) in each loop, to the input ports of the corresponding correlation multiplier. Specifically, F accounts for the port imbalances in the direct path from the input dividers to the top input-ports of the correlators; j does the same for the paths between the input dividers and bottom input-ports of the correlators via the weights, W, and the output feedback path; N does the same for the paths between the input dividers and the bottom input-ports of the correlators via the time-derivative weights, $T_2 dW/dt$, and the derivative-feedback path. Note that the signals in the last two paths are conjugated in the feedback signal $z^*(t)$, so their matrices are accordingly the Hermitian transposes $J^H$ and $N^H$. When $C^H(t)$ is premultiplied by the appropriate matrix in each path (and $X^H(t)C$ is postmultiplied by the one applying to the feedback paths, $J^H$ and $N^H$) and carried through the derivation of (33), the result is $$[I + gGFMN^H]\frac{dW}{dt} + \frac{1}{T_2}[I + gGFMJ^H]W = -\frac{gGFS}{T_2} \quad (34)$$

The steady-state weight is $W_{opt}{}^H = -(J^{H-1}M^{-1}S)^H$ but a corresponding factor J appears in the output equation so it can be shown that the same optimum output is obtained as before (i.e. $Y(t) = D^H X(t) - (M^{-1}S)^H J^{-1} J C^H X(t)$.

In equations (33) and (34) the time-constants are obtained from the matrix coefficients of W(t) when each equation is premultiplied by the inverse of the matrix-coefficient of dW/dt. In (33) $T_i = T_2$ for all i without circuit imbalances. In (34), $T_i$ are obtained from the matrix $\Gamma$ given by $$\Gamma = [I + gGFMN^H]^{-1}[I + gGFMJ^H]/T_2 \quad (35)$$

where in a resonably well-designed system we have $$F = I + \nu, \nu = \text{diag. } [\nu_1, \ldots, \nu_{N-1}], |\nu_i| << 1 \quad (36)$$

$$J = I + \mu, \mu = \text{diag. } [\mu_1, \ldots, \mu_{N-1}], |\mu_i| << 1$$

$$N = I + \eta, \eta = \text{diag. } [\eta_1, \ldots, \eta_{N-1}], |\eta_i| << 1$$

$$M = E\Lambda E^H, E^H = E^{-1}$$

$$\Lambda = \text{diag } [\lambda_1, \ldots, \lambda_{N-1}], 0 < \sigma^2 \leq \lambda_i < N p_{max}.$$

Let $\phi = gGM$ and write $$\begin{aligned}
T_2\Gamma &= [I + F\phi N^H]^{-1}[I + F\phi J^H] \\
&= [I + F\phi N^H]^{-1}[(I + F\phi N^H) - F\phi N^H + F\phi J^H] \\
&= I + [I + F\phi N^H]^{-1} F\phi [J^H - N^H] \\
&= I + [N^{H-1}\phi^{-1}F^{-1} + I]^{-1}[N^{H-1}J^H - I]
\end{aligned}$$

Note that the entries of the diagonal matrix $[N^{H-1}J^H - I]$ are very small so if the matrix factor pre-multiplying it in (36) is not too large, then the right-hand side of (36) could be approximated by I. To get a better insight into the other factor in the RHS of (36) we diagonalize it: Let $N^{H-1}\phi^{-1}F^{-1} = Q\Omega Q^{-1}$ with $\Omega$ still being positive-definite and Q, $Q^{-1}$ playing the role of E, $E^{-1}$. Then (36) can be manipulated into the form $$T_2\Gamma = Q(I + [\Omega + I]^{-1}Q^{-1}[N^{H-1}J^H - I]Q)Q^{-1} \quad (37)$$

Now, a diagonal entry of $[\Omega + I]^{-1}$ will only be large when an entry of $[\Omega + I]$ is small. Entries of $\Omega$ are roughly of the same magnitudes as $1/\lambda_i$ and all positive, so under all conditions, the smallest entry of $[\Omega + I]$ is $> 1$. Thus we can write in this worst case that $[\Omega + I]_{worst}^{-1} = I$ and (37) becomes $$T_2\Gamma = Q(I + Q^{-1}[N^{H-1}J^H - I]Q)Q^{-1} \quad (38)$$

where the worst case means the greatest possible difference of $T_2\Gamma$ from I in (36). When (38) is reduced, the modal time-constants in the worst-case circuit-imbalance conditions are obtained as the diagonal entries of the matrix $\Gamma^{-1}$.

$$\Gamma^{-1} = T_2[N^{N-1}J^H - I] + I)^{-1} \quad (39)$$

$$\text{as } T_i = T_2(1 + \eta_i^*)/(1 + \mu_i^*), i = 1, \ldots, N-1 \quad (40)$$

These are all approximately equal to $T_2$, being perturbed only by the circuit imbalances (e.g. typical power divider port-imbalances of 1 dB and 5° phase give $\eta_i^*$ or $\mu_i^* = \pm(0.12 + j0.01)$). The time-constants are still completely independent of $\lambda_i$ and the signal environment.

For the benefit of showing both the ideal (or average as well as the upper and lower limits of the time-constants of our new algorithm, we chose to characterize them as $$T_i = T_2(1 + bgG\lambda_i)/(1 + agG\lambda_i), i = 1, \ldots, N-1 \quad (41)$$

where $b = 1 \pm \mu_{max}$ and $a = 1 + \eta_{max}$, respectively. This situation corresponds to the direct input paths to the correlators being identical (F = I) and the derivative-weighters being uniformly different from the weighters proper by a constant conversion factor This characterization shows the ideal-time constants as given by (32) when $gG\lambda_i << 1$, and the upper and lower limits given by (40) for worst-case circuit imbalances when $gG\lambda_i >> 1$; it links these values of $T_i$ by simple, slight variation with $\lambda_i$, for comparison with the other algorithms.

In FIG. 6, we compare the "standard" LMS, Compton's improved-feedback loop and our new improved Compton's algorithms when they use the same dominant open-loop time-constants, $T_o$, and loop gains, gG. For this comparison they are characterized by their closed-loop time-constants $T_i$, as functions of the eigenvalues, $\lambda_1$:

Standard LMS: $T_i = T_o/(1 + gG\lambda_i)$ (12)

Compton's: $T_i = T_o/(1 + gG\lambda_i)/(gG\lambda_i)$ (15)

Improved Compton's:
$T_i = T_o/(1 + bgG\lambda_i)/(1 + agG\lambda_i)$ (41)

The values of $T_i/T_o$ for each of the above are plotted over a 30 dB dynamic range of $\lambda_i$ in FIG. 6; equation (15) for $q = 0.1$ and $q = 1.0$ and equation (41) for $(a = 1.12, b = 0.88)$ and $(a = 0.88, b = 1.12)$ which represents about 1 dB of lumped circuit imbalance. As an example we used $gG = 90$ dB and varied $\lambda_i$ from $-100$ dBm to $-70$ dBm of equivalent jamming-power dynamic range.

The time-constants of the latter two algorithms need not be as large as shown in FIG. 6; they can be optimized for faster convergence. It is shown that a time-constant $T_1 \approx 2N/B$ of the averager $A\{.\}$ gives sufficient averaging time for $\overline{XX^H} = M$ to reach its maximum rank. B is the bandwidth of the signals in X. A similar argument can be applied to the closed-loop time-constants of the "standard" LMS algorithm ($T_{i(min)} \approx 10/(\pi B)$ has been suggested in Gabriel's paper). As an example, assume that our "standard LMS needs $T_{i(min)} = 2N/B.$ (42)

Suppose that it is already optimized for the expected range of $\lambda_i$ as in FIG. 6 and that $T_{i(min)}$ occurs when $gG\lambda_i = 100$, which corresponds to $T_{i(min)}/T_{oLMS} = 0.01,$ (43)

i.e. the fastest tolerable mode convergence rate. Taking this back to the origin of our argument gives us the smallest time-constant of the averager, or $T_1$ in our loop as $T_{1(Min)} = T_{i(min)LMS} = 0.01 T_{oLMS}$ (44)

In our algorithm the dominant open-loop time-constant is $T_o = T_2 >> T_{1(min)}$, or about 10 times the minimal averaging interval. But even this value of $T_{1(min)}$ is considered conservatively large, so we can make our $T_2$ only say $5T_{i(min)LMS}$. Using this and (44) gives us our optimized open-loop time-constant for the new algorithm as $T_{o(new)} = 0.05 T_{oLMS}$ (45)

which will also be taken as the optimal open-loop time-constant for Compton's loop with $q = 1$. FIG. 7 shows the optimized closed-loop time-constants of the same three algorithms characterized in FIG. 6, relative to the LMS algorithm which was taken as having already been optimized in FIG. 6. All conditions are the same as in FIG. 6 except now we have Standard LMS (FIG. 1): $T_i = T_{oLMS}/(1 + gG\lambda_i)$ (46)

Compton's (FIG. 2): $T_i = 0.05 T_{oLMS}(1 + qgG\lambda_i)/(gG\lambda_i)$ (47)

Invention (FIG. 3): $T_i = 0.05 T_{oLMS}(1 + bgG\lambda_i)/(1 + agG\lambda_i)$ (48)

The novel arrangement herein is seen to have least-variable time-constants with $\lambda_i$ and least variation of speed, which is not reduced as much as in Compton's loops. As a measure of success in reducing the sensitivity of the convergence-times to the signal environment, one can compare the flatness of the curves of $T_i$ versus $\lambda_i$ for each of the three algorithms in FIGS. 6 and 7. The inventive processor gives the flattest characteristics for all $\lambda_i$ whereas Compton's original loop is flat only for the larger $\lambda_i$ and higher value of its parameter q, while the "standard" LMS algorithm is flat only for the smallest $\lambda_i$ (i.e. for relatively very weak jamming only). Therefore the new processor has the least-sensitive time-constants $T_i$, because it has the most flat $T_i$ versus $\lambda_i$ characteristics.

In FIGS. 8A–8D show a comparison of our new loop with a standard LMS loop having the same open-loop time-constants, in experimental hardware. The two loops were actually the same hardware system switched between "standard LMS" and the novel loop modes, by setting the dW/dt controls to zero for "standard LMS". The loops were employed in a noise-canceller configuration, or a single loop SLC as in FIG. 3, and the step transients were generated by switching the relative phase of the jamming signal in the $\Sigma$ and $\Delta$ "beam" inputs by $\pm 180°$ ever 1.5 ms with a square-wave modulation of the $\Delta$-beam input phase. The beam-input side of the correlator was hard-limited so that $\lambda_i$ was proportional to voltage rather than power. The "desired" signal was set to very low power so as not to obscure the transient residual envelope of the jamming signal in the output. The Figure also shows the transient responses of the real and imaginary parts of the complex weight vector $W = [W_r; W_j]^T$ under variation of jamming power. The dominant open-loop time-constant was $T_o = 150$ µS for both loops. It is seen that when the jamming voltage (i.e. $\lambda_i$ here) is increased by a factor of 2 (6 dB increase in power), the LMS loop convergence-time is reduced by a factor of 2 in accordance with (12) (it tends toward second-order response with higher input power), but for the same conditions, the convergence-time of our new improved-Compton's loop remains the same in accordance with (32) (it tends more toward a pure first-order, constant response with higher input power). The delays in the signal and feedback paths were matched and this sidelobe-canceller operated as shown in FIGS. 8A–8D from 255 MHz to 405 MHz using wideband weighters, power-dividers and correlator. This experiment confirmed that the new loop is robust and stable, and operates in practice as expected from the analysis developed herein.

Turning now to FIG. 4, an embodiment of a system employing the present invention consists of an array of signal sensors 1 (at least 2) which are connected to inputs of a combining matrix 3. The outputs of this combining matrix 3 (i.e. the beam outputs, at least 2 outputs, though the advantage of this present invention is greatest in systems having more than 2 beam outputs)

are in turn each connected to one of identical coherent receivers 101, 103 and 105 (see FIGS. 5A) which can filter, amplify and convert the frequency of the incoming beam output signals, if desired. One beam-output is designated as the main or Σ-Beam (from output Σ), the others being designated as the auxiliary beams. The signal from the main-beam-output may be replaced by a reference signal coherent with the desired signal to be sensed by the elements. The reference signal, $-a(t)$, is supplied by external reference-generating circuitry 107 and connected via a switch 109, which selects either the Σ-beam output or the reference signal, depending on whether the system is intended to operate in mode A or mode B respectively.

The sensing elements 1, the combining matrix 3, the coherent receivers 101, 103 and 105, the switch 109 and reference generator 107 are not part of the present invention itself. Therefore, these items will not be discussed further in more detail, and it will be assumed they are used as necessary together with any particular embodiment of the present invention.

The coherent receivers 101, 103 and 105 and selection switch 109 provide the input signals to the adaptive signal processor 111, comprising, as previously described, a plurality of loops 5, which weights the input signals by adaptively-controlled complex (phase and amplitude) coefficients and coherently combines them to provide an output signal (port 113 for mode A and port 115 for mode B respectively) which contains a minimum of undesired signals and mainly the desired signal, all sensed by the sensor array. Mode A requires one less sensing element than mode B, as a maximum.

The present invention is contained within the adaptive processor 111. This processor consists of up to $N-1$ adaptive control loops 5 which are closed via summing nodes 117, 119, 121, 123 and dividing nodes (power dividers or splitters) 125, 127, 129 and feedback amplifiers 131, 133 and attenuator 135. Each loop receives its input signal from its corresponding coherent receiver and splits it in a 2-way 0° power divider (splitter) 137, part to a compensating delay-line 139 and part to an adaptively controlled complex weighter 141. The output of the weighter 141 is connected directly to summing node 119, along with the outputs of the complex weighters of all the other loops. In operating mode B the interfering signals coherently substract to zero in this node, leaving only the desired signal at its output, which is coupled to the output port 115 via splitter 125. In mode A, the interfering signals are summed coherently together in node 119 such that when coupled to the amplifier 131 via splitter 125, they coherently subtract from the interfering signals present in the main-beam output (from switch 109) inside the summing node 121. The output of summing node 121 is coupled to the output port 113 via splitter 127. The other output port of splitter 127 provides part of the feedback signal, through attenuator 135.

The other port of splitter 137 in each loop provides a sample of the corresponding input signal to the loop. In each loop this sample of input signal is further split in splitter 143, one part propagating into the "REF" port of the complex phase and amplitude comparator 145 via delay line 139 and agc amplifier 147, the other part propagating to the complex weighter 149 (which is the same as complex weighter 141). The complex weighter 149 in each loop is adaptively controlled by the time-derivative of the corresponding complex weight-controlling signals ($W_r(t)$ and $W_j(t)$) that control the complex weighter 141 in each loop, i.e. it is controlled by $T_2 d(W_r(t))$ and $T_2 d(W_j(t)/dt)$.

The outputs of these derivative-controlled weighters 149 of each loop are coherently summed together from all loops in the summing node 117 whose output signal $r(t)$ forms the other portion of the feedback signal. The two portions of the feedback signal (i.e. the portion from 117 plus the output of attenuator 135) are coherently summed together in summing node 123, amplified by amplifier 133 and split by splitter 129 to form (up to $N-1$) identical feedback signals for the (up to $N-1$) loops, thereby closing the loops. The feedback signals are input into the SIG port of the complex phase and amplitude comparator 145 in each loop.

The complex phase and amplitude comparator 145 in each loop multiplies together the corresponding loop input signal and the common feedback signal, forming two output signals: one proportional to the product of the amplitudes of said input and feedback signals and the cosine of their phase difference, at the COS output terminal, the other proportional to the products of the amplitudes of said input and feedback signals and the sine of their phase-difference, at the SIN output terminal. Both output terminals also contain signals with approximately double the frequency of the input feedback signals, but these double-frequency signals are separated out and terminated in the diplex filters 151, 153. The remaining low-frequency portions of the COS and SIN output signals passing out of the diplex filters 151, 153 respectively, are used to obtain the real and imaginary control signals, respectively, for the complex weights, $W_r(t)$, $T_2 dW_r(t)/dt$ and $W_j(t)$, $T_2 dW_j(t)/dt$ respectively, in each loop.

The complex correlator in each loop consists of the complex phase and amplitude comparator 145 and the diplex filters 151 and 153. It forms from its real REF input signal a complex signal by splitting said input signal into "real" and "imaginary" parts in the quadrature splitter 155, and passes the 0° "real" part to the COS multiplier 157, and the $-90°$ quadrature or "imaginary" part to the SIN multiplier 159. The feedback SIG input signal is split into two equal in-phase signals by the splitter 161, one part being passed to the other port of the SIN multiplier 159 and the other part to the other port of the COS multiplier 157. The input ports of said multipliers are high-frequency ports while their output ports are DC-coupled. After the output signals of the COS and SIN multipliers 157 and 159 are passed through their respective diplex filters 151, 153, they form respectively the real and imaginary parts of the complex product of the complex REF input signal and the complex conjugate of the feedback SIG input signal. The collective coherent action of all the correlators yields the complex vector $C^H X(t)z*(t)$ at their outputs.

In each loop the complex weights 141, 149 form from their real input signal a complex input signal by splitting said input signal into "real" and "imaginary" parts in their respective quadrature splitters 163, 165 and pass the 0° or "real" parts to the respective "r" multipliers 167, 169 and the $-90°$ quadrature or "imaginary" parts to the respective "j" multipliers 171, 173. The respective "r" and "j" multipliers are controlled via their DC-coupled input ports by the and by the signals $T_2 dW_r(t)/dt$, $T_2 dW_j(t)/dt$, respectively in the "derivative" weighter 149 $\Delta_n$ each loop. The high-frequency output signals of the "r" and "j" multipliers 167, 171 are summed in phase in the $-0°$ combiner 175 to form the real part of the complex product of the weighter's complex input signal and the complex conjugate of its complex control signal, the collective action of the weighters 141 of all loops yielding the real parts of the complex vector inner product $W^H(t)[C^H X(t)]$ when all outputs of combiners 175 in each loop are coherently added together in phase in summer 119. Similarly, the high-frequency outputs signals of the "r" and "j" multipliers 169, 173 are summed in phase in the 0° combiner 177 to form the real part of the complex product of this "derivative" weighter's complex input signal and the complex conjugate of its complex control signal, the collective action of the "derivative" weighters 149 of all the loops yielding the real part of the complex vector inner product $$T_2 \left[ \frac{dW(t)}{dt} \right]^H [C^H X(t)]$$

when all outputs of combiners 177 in each loop are coherently added together in phase in summer 117.

The complex vectors W(t) and X(t) are defined as $$W(t) = [(w_r(t) + \text{\textcircled{j}} w_j(t))_1, (w_r(t) + \text{\textcircled{j}} w_j(t))_2, \ldots$$
$$(w_r(t) + \text{\textcircled{j}} w_j(t))_{N-1}]^T$$

whose N−1 entires are the complex control signals of weighter 141 in each loop, and $$X(t) = [(x_r(t) + \text{\textcircled{j}} x_j(t))_1, (x_r(t) + \text{\textcircled{j}} x_j(t))_2, \ldots$$
$$(x_r(t) + \text{\textcircled{j}} x_j(t))_N]^T$$

whose N entries are the complex input signals received at the elements.

Complex notation is used throughout the analysis for simplicity and consistence, though all signals are their in-phase ("r") and quadrature ("j") components simultaneously. It is remembered that only the real part of the weighter output signals are actually present, which is sufficient for the user as well as for the algorithm, for their corresponding imaginary parts can be formed simply from the real parts and are therefore redundant, though they are carried through the analysis anyway, to keep it simple and consistent. (This is applicable to relatively narrowband systems embodying the present invention; imaginary parts of the weighter output signals are generated by separate multipliers and summers in full complex weighters in wideband systems).

The weight-controlling signals comprising the complex weight vector W(t) in the present invention have improved convergence properties compared to the weight controlling signals in the prior art, because they are computed by the new and different baseband circuitry of this invention. Their time-derivatives therefore are also new signals.

The new improved weight-controlling signals give the system embodying the present invention a uniform, constant and stable convergence independent of the signal environment being sensed by the sensor array, and completely controllable by simple practical circuit means.

The new improved weight-controlling signals comprising W(t) and its time-derivative $T_2 dW(t)/dt$ are produced by the present invention as follows:

In each loop the "real" and "imaginary" parts of the complex correlator output signals coming from diplex filters 151, 153 are passed to single-pole RC lowpass filters 179, 181 respectively, each of said lowpass filters having a transfer-function $H_1(s) = 1/(1 + sT_1)$ with $R_1 C_1 = T_1 > 2N/B$ where $T_1$ is the averaging time-constant of the system and B is the approximate bandwidth of the input signals comprising input signal vector $C^H X(t)$. The outputs of filters 179, 181 are buffered and amplified by (DC-coupled) amplifiers 183, 185 respectively, said amplifiers having inverting voltage gains, both given by −g, with g>>1, and also having very high impedances and very low output impedances. The outputs of amplifiers 183, 185 in turn are split (by wire taps), one part of each output being input to the non-inverting input of corresponding subtractors 184, 186, the other part to a corresponding lowpass single-pole RC filter 187, 189, respectively, each of said lowpass filters having transfer functions $H_2(s) = 1/(1 + sT_2)$ with $R_2 C_2 = T_2 >> T_1$. (It is sufficient to have $T_2 = 5T_1$). The outputs of lowpass filters 187, 189 are buffered by unit-gain buffer amplifiers 191, 193, respectively (see FIG. 5E). The outputs of buffers 191, 193 are split (by wire taps), one part being input to the inverting port of subtractors 184, 186, respectively, the other to the input ports of summers 195, 197, respectively. The outputs of said subtractors 184, 186 are the time-derivatives of the weight-controlling signals $w_r(t)$, $w_j(t)$, respectively in each loop, each multiplied by $T_2$, i.e. the outputs of said subtractors are respectively $T_2 dw_r(t)/dt$ and $T_2 dw_j(t)/dt$ in each loop. The outputs of summers 195, 197 are the weight-controlling signals with the newly-improved convergence properties, $w_r(t)$ and $w_j(t)$ respectively in each loop. The output signals of summers 195, 197 are applied to the DC coupled input control ports "r" and "j" of multipliers 167, 171 in each loop to effect the adaptive complex weighting functions, while the output signals of subtractors 184, 186 are applied to the DC coupled input control ports "r" and "j" of multipliers 169, 173 respectively, in each loop to effect the time-derivative weighting functions. The other input ports of summers 195 and 197 receive DC offset-compensating voltages $-gV_{off,r}$ and $-gV_{off,j}$ respectively in operating mode A or $S_r$ and $S_j$ steering-vector voltages, respectively, in operating mode B of the system, the voltages being applied via mode-selection switches 196, 198 respectively in each loop. (In an alternate embodiment these offset compensating and steering-vector voltages could be added at amplifiers "−g").

In order to improve the dynamic range of the overall system, amplifiers 147 in each loop and common feedback amplifier 133 are controlled by agc voltages. The agc control voltages for amplifiers 147 are derived from outputs of detectors 199 whose inputs are samples of the corresponding loop input signal after amplification by amplifier 147 and coupling by coupler 201 in each loop. The output signals of detector 199 of each loop are also split (by wire tap) one part being applied to the gain-control terminal of amplifier 147 in each loop and the other part to an input terminal of a combining circuit 203 which combines the detector outputs of all loops to obtain a gain control signal for the common feedback amplifier 133.

In order to ensure stability of operation of all the loops, it is desirable to adjust the phases (by adjusting signal path lengths and with the help of compensating delay-line 139, in each loop) of the correlator input signals such that the phase of the signal at the REF input of correlator (travelling from the splitter 137 in each loop via splitter 143, delay-line 139, amplifier 147 and coupler 201) is the same as the phase of the signal at the SIG port of said correlator (travelling from splitter 137, via weighter 141, summer 119, splitter 125, amplifier 131, summer 121, splitter 127, attenuator 135, summer 123, feedback amplifier 133 and splitter 129). In theory, the system is stable as long as the said phases differ by no more than $+90°$ at the frequency of operation. However, with this newly-improved loop, stability prevails in theory as long as the phase of the latter of the above signals (i.e. signal phase at SIG port of correlator) is within $+90°$ of the phase at the same SIG port of same said correlator, of the signal travelling from splitter 137 in each loop via splitter 143, time-derivative weighter 149, summer 117, summer 123, feedback amplifier 133 and splitter 129 to the SIG port of correlator 145 of each loop.

SECOND EMBODIMENT

When one tries to exploit the advantages of the invention, as above described (hereinafter, the first embodiment), to the maximum in practice, (to achieve the greatest possible speed of convergence and greatest possible suppression of interfering signals), one encounters physical limitations of practical devices, which are not accounted for in the description of the invention. One can perform a simple mathematical operation on the equations describing the invention (i.e. Fourier transform) to obtain an equivalent description in the real-frequency domain (or a Laplace transform, to describe it in the complex-frequency domain), as compared to the present description, which is in the time-domain. In the transform-domains, it is easy to model the limitations of practical-circuit devices as extra factors in the open-loop transfer function (i.e. in the transformed equations describing the system). The complex-frequency (Laplace-transform) closed-loop transfer function for the i-th mode is of the form $$l_i(s) = \frac{-gGH_u(s)H_1(s)H_2(s)k_i}{1 + gGH_u(s)H_1(s)H_2(s)\lambda_i(1+sT_2)}$$

where $H_u(s)$ contains the unwanted poles (e.g. an unwanted real pole at frequency $f_3$ would be represented by the factor $1/(1+s/(2\pi f_3))$.); $s = \sigma + j\omega$ is the complex frequency, $f = \omega/(2\pi)$ being the real frequency; $H_1(s)$ and $H_2(s)$ have been defined previously; the open-loop transfer function is equal to the negative of the denominator plus 1; $gG = g_1$ is a factor of the open-loop gain. When this is done, one finds that the effect of these extra factors is to reduce loop-gain and to increase loop-phase (in a negative direction) at "high" frequencies. "High" in this context means "greater than the larger one of $1/(2\pi T_1)$ and $1/(2\pi T_2)$"; the "better" the circuit components, the higher are the "high" frequencies where the effects of the extra factors become significant. These factors are usually manifest as what is termed "unwanted poles", their primary effect being the addition of "excess phase" to the open-loop transfer function. Since $T_1$ and $T_2$ are limited from below by 2N/B—(see equation (42) above; in the first embodiment $2N/B < T_1 < < T_2$), it is possible that in sufficiently narrow band system (small enough B), the frequencies of the undesired poles can be approached (by $1/(2\pi T_1)$, in the first embodiment, with the consequences that instability of the system will result (i.e. a catastrophe in real life).

In the transform domain it is also seen that the pole of $H_1(S) = 1/(1+sT_1)$ should dominate the open-loop transfer function ($g_1$ and $\lambda_i$ being factors in the open-loop gain), and $H_2(S) = 1/(1+sT_2)$ is absent in the open-loop transfer function However, the unwanted poles modify $H_1(S)$ thereby reducing the stability margins in the open-loop transfer function (i.e. making the whole system more prone to instability if changes in loop-gain or phase occur, due to signal-parameter variations or variations of circuit components) The smaller one makes $T_1$, the worse is the effect of unwanted poles. One tries to use minimum $T_1$ to achieve maximum speed in the first embodiment. Also the greater one makes the loop gain "g", the worse is the effect of unwanted poles. One tries to use the maximum "g" to achieve greatest suppression of the interfering signals (in both embodiments).

It is also readily apparent in the transform domain that $H_2(S) = 1/(1+sT_2)$ is dominant in the closed-loop transfer function and so $1/(2\pi T_2)$ determines the speed of convergence ("speed" varies inversely with $T_2$), and $H_1(S) = 1/(1+sT_1)$ is absent. However, with insufficient loop gain (small "g"), $H_1(S)$ as well as the unwanted poles also have a small effect on the convergence speed.

Now since in the first embodiment we have $T_1 < < T_2$, then for a given desired speed, we may be forced to make $T_1$ so small as to make $1/(2\pi T_1)$ approach the frequencies of the unwanted poles to the extent that instability will result with the desired null-depth (i.e. suppression-ratio for interfering signals, directly equal to total loop-gains of which "g" is one factor). Thus a physical impasse may result in a "high-performance" realization of the first embodiment.

By essentially inverting the proportion of the dominant time-constants $T_1$ and $T_2$ so that $T_1 > > T_2$, the impasse can be broken down almost completely, in most practical situations. For performance to be equivalent to that attempted with the first embodiment, the second embodiment should utilize the same value of $T_2$. Since it was found in practice that $T_2 \approx 5T_1$ suffices to meet requirements of all the assumptions and approximations in the first embodiment, we could specify that $5T_2 \geq T_1 > > T_2$ in the second embodiment, for reasons to be explained shortly, although $T_1 > > T_2$ is also valid in some applications, and is more general. Next, we specify that the factor $T_2/(T_1+T_2)$ in the parameter $\delta$ in the first embodiment be made equal to unity in the second embodiment. (In fact, the practical realization of the first embodiment is with "$T_2/(T_1+T_2)$" replaced by "1" because its value is so close to "1" that even practical circuit errors would obliterate any difference between the ideal value of "$T_2/(T_1+T_2)$" and "1".) Thirdly, in order to maintain validity of all the assumptions and approximations used in the analysis of the second embodiment, we increase the value of loop gain by increasing one of its factors (in practice, usually "g") by the new value of $T_1/T_2$ relative to its value in the first embodiment. (Exactly the same equations apply in the analysis of the second embodiment; the parameter values are the only changes required to turn the first embodiment into the second one). It still remains true in the second embodiment that $T_1$ dominates the open-loop transfer function and hence controls stability, whereas $T_2$ dominates the closed-loop transfer function and controls speed of convergence and 2N/B bounds the values of $T_1$ and $T_2$ from below (i.e. $2N/B < T_2 < < T_1$) in the second embodiment.

The reason why the second embodiment is useful by high speed and high cancellation ratio in the first embodiment can be avoided, because now that $T_1$ is much bigger than before (e.g. typically 25 times bigger), the stability-determining dominant pole, being at $1/(2\pi T_1)$, is much lower than the frequencies of the undesired poles. Consequently, the undesired poles have much less effect on the stability of the system, and the stability margins are much greater than those of the corresponding first embodiment, even with the greater loop gain, in the second embodiment.

The only difference in the closed-loop response of the second embodiment is a slight variation of its convergence-speed, with respect to that of the first embodiment. An N-dimensional embodiment of the invention converges in linear combinations of $N-1$ so-called modes, the i-th mode having an exponential time-constant denoted by $T_i$. In the first embodiment all modes always converge with $$T_i = T_2, i = 1, \ldots, N-1,$$

whereas in the second embodiment, the $T_i$ are given by $$T_i = T_2 \frac{(1 + g_1 \lambda_i)}{(T_2/T_1 + g_1 \lambda_i)}, i = 1, \ldots, N-1$$

where $g_1$ denotes loop-gain, $\lambda_i$ is the i-th eigenvalue of the covariance matrix of the interfering signals ($g_1\lambda_i$ is the complete open-loop gain of the i-th mode; normally $g_1\lambda_i \gg 1$). Consequently, for most interfering signals of interest, $T_i \approx T_2$ also in the second embodiment, the upper bound on $T_i$ being $T_1$ when $\lambda_i \to 0$. One could also use values of $T_1 \to \infty$ and $g_1 \to \infty$ simultaneously in the second embodiment (whereby "$gH_1(S)$" becomes a pure integrator and $T_i$ versus $\lambda_i$ approaches the behaviour of Compton's original "improved-feedback loop" but without the slowing-down phenomenon relative to the very original, basic LMS loop).

In summary, the second possible embodiment of the present invention can be created from the first embodiment thereof solely by changing the values of parameters as follows (for equivalent or better performance).

TABLE 1

| Parameter in first embodiment | Becomes | Parameter in second embodiment | (Change) |
|---|---|---|---|
| $2N/B$ | → | $2N/B$ | (same) |
| $T_2$ | → | $T_2$ | (same) |
| $T_1 \ll T_2$ (e.g. $T_2 = 5T_1$) | → | $T_1 \gg T_2$ (e.g. $T_1 = 5T_2$) | $T_1$ increases |
| $g_1 \gg 1$ | → | $g_1\left(\frac{T_1}{T_2}\right) \gg 1$ | $g_1$ increases |
| (e.g. $g_1 = 1000$) | → | $\left(\text{e.g.}\left(\frac{T_1}{T_2}\right)g_1 = 5000\right)$ | |
| $\left(\frac{T_2}{T_1+T_2}\right) = \delta$ (FIG. 3) | → | 1 | |
| or $\left(\frac{T_2}{T_1+T_2}\right)\frac{\sqrt{2}}{r}$ (FIG. 4) | → | $\frac{\sqrt{2}}{T}$ | |

The resulting effects on performance are:

TABLE 2

| Performance parameter of first embodiment | Becomes | Performance parameter in second embodiment | (Change) |
|---|---|---|---|
| Stability margins (Phase and gain margins | → | Greater phase and gain margins | stability increases |
| $T_i = T_2$ | → | $T_i = T_2\left(\frac{1 + g_1 \lambda_i}{T_2/T_1 + g_1 \lambda_i}\right)$ | $T_i$ same for $g_1\gamma_i \gg 1$, $T_i$ increases for $g_1\gamma_i \ll 1$ |
| Cancellation ratio $CR_i \approx 20 \text{LOG}_{10}(\gamma_i g_1)$ | → | Cancellation ratio $CR_i = 20 \text{LOG}_{10}\left(\frac{T_1}{T_2} g_1 \lambda_i\right)$ | $CR_i$ increases |

Of course, one can also aim for different performance in the second embodiment relative to that of the first, by for example choosing $T_2$ smaller than in the first embodiment, and/or making $T_1$ very large and increasing loop-gain by a factor somewhat greater or smaller than the new value of $(T_1/T_2)$, so long as the relative proportions of $T_1$, $T_2$, $g_1$ $(T_1/T_2)$ are maintained and the the factor $\underline{\delta}$ is appropriately modified ($\delta = 1$ in FIG. 3 or $\delta = \sqrt{2}/r$ in FIG. 4 if FIGS. 3 and 4 are used for the second embodiment, respectively).

APPENDIX A

Application of the Newton-Raphson Method to Optimizing the Weights of an Adaptive Array We show here how the iterative Newton-Raphson method for finding zeroes of a function is used to find the (unique) zero of the gradient of the average residual output power with respect to the adaptive weights. The average output power of the SLC array treated in this description is $$\overline{|y(t)|^2} = D^H RD + W^H C^H RCW + D^H RCW + W^H C^H RD). \tag{A1}$$

therefore its gradient with respect to the weights is $$\nabla_w \overline{|y(t)|^2} = 2(C^H RCW + C^H RD). \tag{A2}$$

When (A2) is cast into diagonal form using $C^H RC = E\Lambda E^H$, $W = EL$, $C^H RD = EK$ and $E^H = E^{-1}$, it becomes $$E^H \nabla_w \overline{|y(t)|^2} = 2(\Lambda L + K) \tag{A3}$$

and when (A1) is transformed likewise, it becomes $$\overline{|y(t)|^2} = D^H RD + L^H \Lambda L + K^H L + L^H K. \tag{A4}$$

In place of (A2) we can take the gradient of (A4) with respect to L as $$\nabla_L \overline{|y(t)|^2} = 2(\Lambda L + K) \tag{A5}$$

which is also equal to (A3). We now apply the Newton-Raphson method to each of the uncoupled components of (A5), i.e. to $$\frac{\partial}{\partial l_i} \overline{|y(t)|^2} = 2(\lambda_i l_i + k_i), \; i = 1,\ldots, N-1 \tag{A6}$$

In the Newton-Raphson method the successive approximations of the zeroes, $l_n$, of a function, $f(l)$, are given by iterations of $$l_{n+1} = l_n - f(l_n) / \left[ \frac{\partial f(l)}{\partial l} \bigg|_{l=l_n} \right]. \tag{A7}$$

In (A6), $f(l_i) = 2(\lambda_i l_i + k_i)$ so $\partial f / \partial l_i = \lambda_i$. We can take (A7) into continuous time as $$\lim_{\substack{\Delta t \to 0 \\ n \to \infty}} \frac{l_i((n+1)\Delta t) - l_i(n\Delta t)}{(n+1)\Delta t - n\Delta t} = -\mu \left[\frac{\partial f(l_i)}{\partial l}\right]^{-1 f(l_i)}$$

$$n\Delta t = t \text{ is finite}$$

which is recognized as $$\frac{dl_i}{dt} = -2\mu \lambda_i^{-1} (\lambda_i l_i + k_i) \tag{A8}$$

where $\mu$ is a constant of proportionality needed to keep the units consistent when associating units of time with the iteration interval. In matrix form (A8) is $$\frac{dL}{dt} = -2\mu \Lambda^{-1} (\Lambda L + K)$$

which when transformed back to W-space becomes $$\frac{dW}{dt} = 2\mu M^{-1}(MW + S) = \mu M^{-1} \overline{\nabla_w |y(t)|^2} \tag{A9}$$

where $M = C^H RC$, $S = C^H RD$ and (A2) were used. Equation (A9) is recognized as having exactly the same form as the first-order dominant governing equation (33) of our new improved-Compton's feedback loop which is rewritten here as $$\frac{dW}{dt} = -\frac{1}{T_2}[I/gG + M]^{-1}([I/gG + M]W + S). \tag{33}$$

It is a more exact form of Newton-Raphson continuous iteration than the governing equation of Compton's original improved-feedback loop (13), which for comparison is rewritten as $$\frac{dW}{dt} = -2k[I/2k + cM]^{-1}(MW + S). \tag{13}$$

In (13) the matrix coefficients of W do not cancel exactly, as they do in (33) and in Newton's method, so the convergence of (33) is not as uniform as that of (33).

Although particular embodiments have been above-described, this was for the purpose of illustrating, but not limiting, the invention. Various modifications, which may come readily to the mind of invention as defined in the appended claims.

I claim:

1. For use with a sensor array arrangement, which senses both a desired signal and interference signals having an intensity and characterized by relative amplitudes and phases, comprising a first plurality of sensors connected to a combining matrix having a second plurality of outputs, an adaptive signal processor for causing constant convergence of weights which reduce the intensity of interference signals, while preserving the desired signal, independently of signal parameters at an output terminal means of said adaptive processor;

said second plurality being less than or equal to said first plurality;

said adaptive signal processor comprising:

a third plurality of adaptive control loops;

said third plurality being less than or equal to said second plurality;

(A) each said control loop comprising:

each input terminal connected to a different one of said second plurality of outputs of said combining matrix;

a first power divider having an input terminal, a first output terminal and a second output terminal, the input terminal of said control loop being connected to the input terminal of said first power divider;

a second power divider having an input terminal, a first output terminal and a second output terminal;

the first output terminal of said first power divider being connected to the input terminal of said second power divider;

a first complex weighter means having first input terminal means, second input terminal means and output terminal means;

the second output terminal of said second power divider being connected to the first input terminal means of said first complex weighter means;

complex correlator means having first input terminal means, second input terminal means and output terminal means;

the first output terminal of said second power divider being connected to the first input terminal means of said complex correlator means;

a filter arrangement having input terminal means and a first and second output terminal means;

the input terminal means of said filter arrangement being connected to the output terminal means of said complex correlator means;

the first output terminal means of said filter arrangement being connected to the second input terminal means of said first complex weighter means;

second complex weighter means having first input terminal means, second input terminal means and output terminal means;

the second output terminal means of said filter arrangement being connected to the second input terminal means of said second complex weighter means;

the second output terminal of said first power divider being connected to the first input terminal means of said second complex weighter means;

(B) said loops being closed by:

first summer means having a plurality of input terminals, said plurality being equal to said second plurality, and an output terminal means;

one input terminal of said first summer means being connected to a source of a reference signal;

the input terminals of said first summer means being connected to said output terminal means of said second complex weighter means of respective ones of the control loops;

second summer means having a plurality of input terminals equal to said third plurality and an output terminal;

the input terminals of said second summer means being connected to said output terminal means of said first complex weighter means of respective ones of the control loops;

a third power divider having an input terminal, a first output terminal and a second output terminal;

the input terminal of said third power divider being connected to the output terminal means of said first summer means;

third summer means having first input terminal, a second input terminal and an output terminal;

the first input terminal of said third summer means being connected to the first output terminal of said third power divider;

a fourth power divider having an input terminal and a plurality of output terminal equal to said third plurality;

the input terminal of said fourth power divider being connected to the output terminal of said third summer means;

the output terminals of said fourth power divider being connected to second input terminals of complex correlator means of respective ones of said control loops; and the second output terminal of said third power divider comprising output terminal means of said adaptive signal processor;

whereby, in each said loop, said first power divider directs said desired signal and interference signals into a first path and a second path, the first path leading said desired signal and interference signals, via said second complex weighter means, which adjust said relative amplitudes and phases of said desired signal and interference signals, and subsequently via said first summer means, which causes said interference signals from all said loops to coherently subtract to zero, thereby reducing the intensity of said interference signals from all of said loops, and subsequently to the input terminal of said third power divider;

said second path leading said desired signal and interference signals to the input terminal of said second power divider;

said second power divider further detecting said desired signal and interference signals into a third path and a fourth path, said third path leading said desired signal and interference signals to said first input terminal means of said complex correlator means, and said fourth path leading said desired signal and interference signals, via said first complex weighter means, to said input terminal of said second summer means, and thence, to said second input terminal of said third summer means;

said third power divider further directing any residual remnants of said interference signals and said desired signal into a fifth path which leads said desired signal and said interference signals to said output terminal means of said adaptive processor, and also into a sixth path which leads said desired signal and said interference signals to said first input terminal means of said third summer means, which coherently sums the desired signal and interference signals from the sixth path and the desired signal and interference signals from the fourth path and outputs their sum to the input terminal of said fourth power divider means, said fourth power divider means then directing said sum of said desired signals and interference signals of all of said loops into said third plurality of paths each leading to a second input terminal means of said complex correlator means of respective ones of said control loops;

said complex correlator means of each said loop correlating said desired signals and said interference signals arriving into said first input terminal means thereof via said third path with said desired signal and interference signals arriving into the the second input terminal means thereof to produce a resultant signal which is passed to said input terminal means of said filter arrangement, said resultant signal being processed by said filter arrangement so as to produce, at its first output terminal means, a first control signal which is applied to said second input terminal means of said first complex weighter means of each said loop, and, at the second output terminal means thereof, to produce a second control signal which is applied to said second input terminal means of said second complex weighter means of each said loop;

said first complex weighter means of each loop aiding said second control signal for said second complex weighter means of each loop to achieve a constant rate of convergence to an optimal state which causes said interference signals to subtract as they pass through said first summer means thereby reducing the intensity of said interference signals at the output of said adaptive processor.

2. The processor as defined in claim 1 wherein said filter arrangement comprises a first RC filter having a time constant $T_1$ and a second RC filter having a time constant $T_2$ such that $T_1$ is less than $T_2$;

said first RC filter having a transfer function $1/(1+sT_1)$ and said second RC filter having a transfer function $1/(1+sT_2)$.

3. The processor as defined in claim 2 wherein each said control loop further comprises a subtractor having a first input terminal and a second input terminal, said second input terminal of said subtractor being the inverting input terminal, said control loop further comprising an inverting amplifier, said inverting amplifier having voltage gain $-g$, an input terminal and an output terminal;

said first RC filter having an input terminal and an output terminal and said second RC filter having an input terminal and an output terminal;
the output terminal of said first RC filter being connected to the input terminal of said inverting amplifier, the output terminal of said inverting amplifier to the first input terminal of said subtractor and the input terminal of said second RC filter;
the output terminal of said second RC filter being connected to the second input terminal of said subtractor through a unity-gain buffer amplifier;
the output terminal of said subtractor being connected to the second input terminal of said first complex weighter means.

4. The processor as defined in claim 3 and further including attenuator means connected between the first output terminal of said third power divider and the first input terminal of said third summer.

5. The processor as defined in claim 4 and further comprising first amplifier means having an input terminal and an output terminal:

the output terminal of said third summer means being connected to the input terminal of said first amplifier;
the output terminal of said first amplifier being connected to the input terminal of said fourth power divider.

6. The processor as defined in claim 5 wherein said source of reference signal comprises a main beam signal provided by a Σ-output port of said combining matrix.

7. The signal processor as defined in claim 6 which produces signals W(t) which control adaptively the weighting circuits according to the following differential equation:

$$\frac{d^2}{dt^2} W(t) + \frac{1}{T_1}\left[(1 + T_1/T_2)I + \frac{T_1}{T_2} gGC^H X(t) X^H(t) C \right]\frac{dW(t)}{dt} +$$

$$\frac{1}{T_1 T_2}\left[I + \frac{T_1}{T_2} gGC^H X(t) X^H(t) C \right] W(t) =$$

$$\frac{-gGT_1/T_2}{T_1 T_2} C^H X(t) X^H(t) D$$

where
W(t) is a complex vector of weight-controlling signals,
X(t) is a complex vector of composite signals sensed by the sensor array of bandwidth B,
$C^H X(t)$ being auxiliary outputs of the combining matrix,
$D^H X(t)$ being a main output of the combining matrix,
$T_1$ is a time constant of a first single pole RC lowpass filter,
$T_2 > 2$ N/B when B is defined above and N is the number of the first plurality of said weighting sensor elements;

$T_2$ is a time-constant of a second single-pole RC lowpass filter which governs overall convergence of the weight-controlling signals; $T_1 >> T_2$, $$-g\frac{T_1}{T_2}$$

is negative DC gain of each loop, and
G is feedback gain of each loop.

8. The processor as defined in claim 1 wherein each said complex weighter means comprises:

a quadrature splitter having an input terminal and a first output terminal and a second output terminal;
a 0° combiner having a first input terminal, a second input terminal and an output terminal;
said input terminal of said quadrature splitter comprising said first input terminal means of each said complex weighter;
said output terminal of said 0° combiner comprising said output terminal means of each said complex weighter;
each said complex weighter means further comprising;
a first multiplier having a first input terminal, a second input terminal and an output terminal;
a second multiplier having a first input terminal, a second input terminal and an output terminal;
said first output terminal of said quadrature splitter being connected to the first input terminal of said first multiplier, and said second output terminal of said quadrature splitter being connected to the first input terminal of said second multiplier;
said second input terminal of said first multiplier and said second input terminal of said second multiplier comprising said second input terminal means of each said complex weighter;
the output terminal of said first multiplier being connected to the first input terminal of said 0° combiner and said output terminal of said second multiplier being connected to the second input terminal of said 0° combiner.

9. The processor as defined in claim 8 wherein said complex correlator means comprises:

a quadrature splitter having an input terminal and a first output terminal and a second output terminal;
a 0° splitter having an input terminal, a first output terminal and a second output terminal;
said input terminal of said quadrature splitter comprising said first input terminal means of said complex correlator means;
said input terminal of said 0° splitter comprising said second input terminal means of said complex correlator means;
said complex correlator means further comprising:
a first multiplier having a first input terminal, a second input terminal and an output terminal;
a second multiplier having a first input terminal, a second input terminal and an output terminal;
said first output terminal of said quadrature splitter being connected to the first input terminal of said first multiplier, and said second output terminal of said quadrature splitter being connected to the first input terminal of said second multiplier;
said output terminal of said first multiplier and said output terminal of said second multiplier comprising said output terminal means of said complex correlator means;

the second input terminal of said first multiplier being connected to the first output terminal of said 0° splitter and said second input terminal of said second multiplier being connected to the second output terminal of said 0° splitter;

a first diplex filter having an input terminal and an output terminal;

a second diplex filter having an input terminal and an output terminal;

the output terminal of said first multiplier of said complex correlator means being connected to the input terminal of said first diplex filter;

the output terminal of said second multiplier being connected to the input terminal of said second diplex filter.

10. The processor as defined in claim 9 and further including first amplifier means having an input terminal and an output terminal and delay line means having an input terminal and an output terminal;

the input terminal of said first amplifier means being connected to the output terminal of said delay line means;

the output terminal of said first amplifier being connected to the input terminal of said quadrature splitter of said complex correlator means; and second amplifier means having an input terminal and an output terminal;

the input terminal of said second amplifier being connected to the output terminal of said third summer means;

the output terminal of said amplifier being connected to the input terminal of said fourth power divider.

11. The processor as defined in claim 10 and further including automatic gain control means for said first and second amplifiers.

12. The processor as defined in claim 11 wherein:
the second output terminal of said second power divider is connected to the input terminal of said delay line means; and the input terminal of said first amplifier is connected to the output terminal of said delay line means.

13. The processor as defined in claim 12 wherein said filter arrangement comprises a first filter path having an input terminal and a first and second output terminal and a second filter path having an input terminal and a first and a second output terminal;

said input terminal of said first filter path being connected to the output terminal of said first diplex filter and said first output terminal of said first filter path being fed to the second input terminal of said first multiplier of said first weighter means;

the input terminal of said second filter path being connected to the output terminal of said second diplex filter, and said first output terminal of said second filter path being connected to the second input terminal of said second multiplier of said first weighter means.

14. The processor as defined in claim 13 wherein said first filter path comprises a first RC filter having a time constant $T_1$ and a second RC filter having a time constant $T_2$ such that $T_1$ is less than $T_2$ and a first inverting amplifier having voltage gain of $-g$;

said first RC filter having an input terminal and an output terminal and said first inverting amplifier having an input and an output terminal and said second RC filter having an input terminal and an output terminal, the output terminal of said first RC filter being connected to the input terminal of said first inverting amplifier and the output terminal of said amplifier to the input terminal of said second RC filter;

said second filter path comprising a third RC filter having a time constant $T_1$ and a fourth RC filter having a time constant $T_2$ such that $T_1$ is less than $T_2$ and a second inverting amplifier having a voltage gain of $-g$;

said third RC filter having an input terminal and an output terminal and said second inverting amplifier having an input and an output terminal, and said fourth RC filter having an input terminal and an output terminal, the output terminal of said third RC filter being connected to the input terminal of said second inverting amplifier, and the output terminal of said amplifier to the input terminal of said fourth RC filter;

said first and third RC filters having transfer functions $1/(1+sT_1)$ and second and fourth RC filters having transfer functions $1/(1+sT_2)$.

15. The processor as defined in claim 14 wherein each said control loop further comprises a first and a second subtractor and a fourth and a fifth summer, and a first and a second unity-gain buffer amplifier, each said first and second subtractor having a first input terminal and a second input terminal, the second input terminal of each said subtractors being the inverting input terminal, each said first and second subtractor further having an output terminal, said unity-gain buffer amplifiers each having an input and an output terminal and said fourth and fifth summers each having a first input terminal and a second input terminal and an output terminal;

the output terminal of said first inverting amplifier being connected to the first input terminal of said first subtractor and also to the input terminal of said second RC filter;

the output terminal of said second RC filter is connected to the input terminal of said first unity-gain buffer amplifier, the output terminal of said buffer is connected to said second input terminal of said first subtractor and also to the first input terminal of said fourth summer;

the output terminal of said fourth summer is connected to the second input terminal of said first multiplier of said second complex weighter means;

the output terminal of said third RC filter being connected to the input terminal of said second inverting amplifier, and the output terminal of said second inverting amplifier to first input terminal of said second subtractor and also to the input terminal of said fourth RC filter;

the output terminal of said fourth RC filter being connected to the input terminal of said second unity-gain buffer amplifier, the output terminal of said unity-gain buffer amplifier to the second input terminal of said second subtractor and also to the first input terminal of said fifth summer;

the output terminal of said fifth summer being connected to the second input terminal of said second multiplier of said second complex weighter means.

16. The processor as defined in claim 15 wherein said first summer means comprises:

a sixth summer having a plurality of input terminals equal to said third plurality, and an output terminal;

a fifth power divider having an input terminal and a first output terminal and a second output terminal;

amplifier means having an input terminal and an output terminal; and a seventh summer having a first input terminal and a second input terminal and an output terminal;

the output terminal of said sixth summer being connected to the input terminal of said fifth divider;

the first output terminal of said fifth divider being connected to the input terminal of said amplifier;

the second output terminal of said fifth divider comprising an alternate output of the first summer means;

the output terminal of said amplifier being connected to the first input terminal of said seventh summer;

the second input terminal of said seventh summer comprising the one input terminal of said first summer means which is connected to the source of reference signal;

the plurality of input terminals is connected to said sixth summer comprising the other input terminals of said first summer means.

17. The processor as defined in claim 16 wherein said source of reference signal comprises a main beam signal provided by a $\Sigma$-output port of said combining matrix; and a first switch with an output terminal and a first and a second input terminal;

the output terminal of said first switch being connected to the second input terminal of said seventh summer, the first input terminal of said first switch being connected to the $\Sigma$-output port of the said combining matrix, and the second input terminal of said first switch being connected to an external source of reference signal.

18. The signal processor as defined in claim 6 or 16 which produces signals W(t) which control adaptively the weighting circuits according to the following differential equation:

$$\frac{d^2}{dt^2} W(t) + \frac{1}{T_1}[(1 + T_1/T_2)I + gGC^HX(t)X^H(t)C]\frac{dW(t)}{dt} +$$

$$\frac{1}{T_1T_2}[I + \delta gGC^HX(t)X^H(t)C]W(t) =$$

$$\frac{-\delta gG}{T_1T_2} C^HX(t)X^H(t)D$$

where

W(t) is a complex vector of weight-controlling signals,

X(t) is a complex vector of composite signals sensed by the sensor array of bandwidth B, $C^HX(t)$ being auxiliary outputs of the combining matrix, $D^HX(t)$ being a main output of the combining matrix, $\delta = T_2/(T_1+T_2)$ is a voltage attenuation coefficient in the output feedback path, $T_1$ is a time constant of a first single pole RC lowpass filter, $T_1 > 2$ N/B when B is defined above and N is the number of the first plurality of said sensor elements;

$T_2$ is a time-constant of a second single-pole RC lowpass filter which governs overall convergence of the weight-controlling signals, $T_2 >> T_1$, $-g$ is negative DC gain of each loop, and G is feedback gain.

19. The signal processor as defined in claim 6 or 17 which produces signal W(t) which controls adaptively the weighting circuits according to the following equation:

$$W(t) - W(0) = (1 - e^{-t/T_2})(W_{opt} - W(0))$$

where

W(0) is the initial condition weight vector, $W_{opt} = [I(1/gG) + C^HRC]^{-1}C^HRD$ is the optimal steady-state weight-vector where $R = \overline{X(t)X^H(t)}$.

20. The processor as defined in claim 1 wherein said filter arrangement comprises a first RC filter having a time constant $T_1$ and a second RC filter having a time constant $T_2$ such that $T_2$ is much less than $T_1$;

said first RC filter having a transfer function $1/(1+sT_1)$ and said second RC filter having a transfer function $1/(1+sT_2)$.

21. The processor as defined in claim 20 wherein each said control loop further comprises a subtractor having a first input terminal and a second input terminal, said second input terminal of said control loop being the inverting input terminal, said control loop further comprising an output terminal and an inverting amplifier, said inverting amplifier having voltage gain $-gT_1/T_2$, an input terminal and an output terminal;

said first RC filter having an input terminal and an output terminal and said second RC filter having an input terminal and an output terminal;

the output terminal of said first RC filter being connected to the input terminal of said inverting amplifier, the output terminal of said inverting amplifier to the first input terminal of said subtractor and the input terminal of said second RC filter;

the output terminal of said second RC filter being connected to the second input terminal of said subtractor through a unity-gain buffer amplifier;

the output terminal of said subtractor being connected to the second input terminal of said first complex weighter means.

22. The processor as defined in claim 21 and further including attenuator means connected between the first output terminal of said third power divider and the first input terminal of said third summer.

23. The processor as defined in claim 22 and further comprising first amplifier means having an input terminal and an output terminal;

the output terminal of said third summer means being connected to the input terminal of said first amplifier;

the output terminal of said first amplifier being connected to the input terminal of said fourth power divider.

24. The processor as defined in claim 23 wherein said first filter path comprises a first RC filter having a time constant $T_1$ and a second RC filter having a time constant $T_2$ such that $T_2$ is less than $T_1$ and a first inverting amplifier having voltage gain of $-gT_1/T_2$;

said first RC filter having an input terminal and an output terminal and said first inverting amplifier having an input and an output terminal and said second RC filter having an input terminal and an output terminal, the output terminal of said first RC filter being connected to the input terminal of said first inverting amplifier and the output terminal of said amplifier to the input terminal of said second RC filter;

said second filter path comprising a third RC filter having a time constant $T_1$ and a fourth RC filter having a time constant $T_2$ such that $T_2$ is less than $T_1$ and a second inverting amplifier having a voltage gain of $-gT_1/T_2$;

said third RC filter having an input terminal and an output terminal and said second inverting amplifier having an input and an output terminal, and said fourth RC filter having an input terminal and an output terminal, the output terminal of said third RC filter being connected to the input terminal of said second inverting amplifier, and the output terminal of said amplifier to the input terminal of said fourth RC filter;

said first and third RC filters having transfer functions $1/(1+sT_1)$ and second and fourth RC filters having transfer functions $1/(1+sT_2)$.

25. The processor as defined in claim 24 wherein each said control loop further comprises a first and a second subtractor and a fourth and a fifth summer, and a first and a second unity-gain buffer amplifier, each said first and second subtractor having a first input terminal and a second input terminal, the second input terminal of each said subtractors being the inverting input terminal, each said first and second subtractor further having an output terminal, said unity-gain buffer amplifiers each having an input and an output terminal and said fourth and fifth summers each having a first input terminal and a second input terminal and an output terminal;

the output terminal of said first inverting amplifier being connected to the first input terminal of said first subtractor and also to the input terminal of said second RC filter;

the output terminal of said second RC filter being connected to the input terminal of said first unity gain buffer amplifier, the output terminal of said buffer to second input terminal of said first subtractor and also to the first input terminal of said fourth summer;

the output terminal of said fourth summer being connected to the second input terminal of said first multiplier of said second complex weighter means;

the output terminal of said third RC filter being connected to the input terminal of said second inverting amplifier, and the output terminal of said second inverting amplifier to first input terminal of said second subtractor and also to the input terminal of said fourth RC filter;

the output terminal of said fourth RC filter being connected to the input terminal of said second unity gain buffer amplifier, the output terminal of said unity-gain buffer amplifier to the second input terminal of said second subtractor and also to the first input terminal of said fifth summer;

the output terminal of said fifth summer being connected to the second input terminal of said second multiplier of said second complex weighter means.

26. The processor as defined in claim 25 wherein said first summer means comprises:

a sixth summer having a plurality of input terminals equal to said third plurality, and an output terminal;

a fifth power divider having an input terminal and a first output terminal and a second output terminal;

amplifier means having an input terminal and an output terminal; and a seventh summer having a first input terminal and a second input terminal and an output terminal;

the output terminal of said sixth summer being connected to the input terminal of said fifth divider;

the first output terminal of said fifth divider being connected to the input terminal of said amplifier;

the second output terminal of said fifth divider comprising an alternate output of the first summer means;

the output terminal of said amplifier being connected to the first input terminal of said seventh summer;

the second input terminal of said seventh summer comprising the one input terminal of said first summer means which is connected to the source of reference signal;

the plurality of input terminals to said sixth summer comprising the other input terminals of said first summer means.

27. The processor as defined in claim 26 wherein said source of reference signal comprises a main beam signal provided by a $\Sigma$-output port of said combining matrix; and a first switch with an output terminal and a first and a second input terminal;

the output terminal of said first switch being connected to the second input terminal of said seventh summer, the first input terminal of said first switch being connected to the $\Sigma$-output port of said combining matrix, and the second input terminal of said first switch being connected to an external source of reference signal.

28. The processor as defined claim 23 wherein said source of reference signal comprises a main beam signal provided by a $\Sigma$-output port of said combining matrix.

29. The signal processor as defined in claim 28 which produces signals $W(t)$ which control adaptively the weighting circuits according to the following differential equation:

$$\frac{d^2}{dt^2} W(t) + \frac{1}{T_1}\left[(1 + T_1/T_2)I + \frac{T_1}{T_2} gGC^H X(t)X^H(t)C\right]\frac{dW(t)}{dt} + \frac{1}{T_1 T_2}\left[I + \frac{T_1}{T_2} gGC^H X(t)X^H(t)C\right]W(t) = \frac{-gGT_1/T_2}{T_1 T_2} C^H X(t)X^H(t)D$$

where $W(t)$ is a complex vector of weight-controlling signals, $X(t)$ is a complex vector of composite signals sensed by the sensor array of bandwidth B, $C^H X(t)$ being auxiliary outputs of the combining matrix, $D^H X(t)$ being a main output of the combining matrix, $T^1$ is a time constant of a first single pole RC lowpass filter, $T_2 > 2 N/B$ when B is defined above and N is the number of the first plurality of said sensor elements;

$T_2$ is a time-constant of a second single-pole RC lowpass filter which governs overall convergence of the weight-controlling signals, $T_1 \gg T_2$, $$-g\frac{T_1}{T_2}$$

is negative DC gain of each loop, and
G is feed back gain of each loop.

30. The signal processor as defined in claim 28 which produces signal W(t) which controls adaptively the weighting circuits according to the following equation:

$$W(t) - W(0) = (1 - e^{-t/T_2})(W_{opt} - W(0)).$$

where
W(0) is the initial condition weight vector,
$W_{opt} = [I(T_2/gT_1) + C^H RC]^{-1} C^H RD$ is an optimal steady-state weight-vector where $R = \overline{X(t)X^H(t)}$.

31. In combination with an array of a number of sensor elements adapted to sense both desired signals and interference signals having an intensity characterized by frequencies, relative phases and amplitudes having a broad range of values, an adaptive signal processor, having an output, for producing constant convergence of weights which reduce the intensity of interference signals while preserving the desired signals at the output of said adaptive signal processor, independently of signal parameters, comprising:
a combining network;
a plurality of coherent receivers equal to or less than the number of sensor elements;
said combining network interconnecting at least some of the sensor elements with at least some of said coherent receivers;
said adaptive signal processor further comprising a plurality of loops less than or equal to the plurality of said coherent receivers, said loops having outputs;
each said coherent receiver being connected to an input of a respective one of said loops when said plurality of coherent receivers is equal to the plurality of loops and one coherent receiver being connected to one input of a summing circuit, having an output, when the plurality of coherent receivers is one more than the plurality of loops;
the outputs of said loops being connected to said summing circuit;
common circuitry for closing all of said loops including said summing circuit and dividing circuits;
said adaptive signal processor effecting adaptive weight controlling signals which converge with a constant, stable rate to their steady state due to an optimal feedback signal provided by said summing circuit and said dividing circuits of said adaptive signal processor;
said combining network and said coherent receivers changing said amplitudes and frequencies and relative phases of said interference signals and said desired signals to a second range of values;
said loops containing and controlling said weights which adjust said relative phases and amplitudes of said interference signals and said desired signals in a fixed amount of time which is independent of said signal parameters so that when said weights have reached steady state values, said weights cause said interference signals to be subtracted within said summing circuit, thereby reducing the intensity of said interfering signals;
said summing circuit providing optimal feedback signals to said loops in order to cause said loops to adjust said weights in the above-described fashion.

32. The combination as defined in claim 31 which adaptively controls variable complex weighting circuits so as to suppress the interference signals at the output of said summing circuit in a set amount of time, the time being determined solely by circuit parameters meters of said loops and independent of the signal environment of the array of sensor elements;
said constant convergence of weights converging in time to optimum values following Newton-Raphson technique of iterating a weight-vector solution to a point of zero gradient of an hyper-paraboloidal performance surface with respect to a weight vector.

33. The signal processor as defined in claim 32 which additionally adaptively controls additional variable complex weighting circuits by time-derivatives of weight-controlling signals, said time-derivatives being premultiplied by a time constant of exponential convergence in time of the said weight-controlling signals.

34. The signal processor as defined in claim 33 wherein one output from said combining network is mathematically summed with the outputs of said loops in a first summer, so as to eliminate the interference signals from among the signals sensed to thereby provide at the output of said processor the desired signals, and to further provide a sample of said output signal to a second summer.

35. The signal processor as defined in claim 34 wherein said summing circuitry also contains a third summer, having an output, which mathematically sums the derivative weighted signals and adds this output to the sample of output from the first summer; and
amplifier means for amplifying the output of said third summer and distributing equal samples of it via a splitter to feedback inputs of the weight-controlling circuits.

36. The signal processor as defined in claim 35 which produces signals W(t) which control adaptively the weighting circuits according to the following differential equation:

$$\frac{d^2}{dt^2} W(t) + \frac{1}{T_1} [(1 + T_1/T_2)I + gGC^H X(t)X^H(t)C] \frac{dW(t)}{dt} +$$

$$\frac{1}{T_1 T_2} [I + \delta g G C^H X(t) X^H(t) C] W(t) =$$

$$\frac{-\delta g G}{T_1 T_2} C^H X(t) X^H(t) D$$

where
W(t) is a complex vector of weight-controlling signals,
X(t) is a complex vector of composite signals sensed by the sensor array of bandwidth B,
$C^H X(t)$ being auxiliary outputs of the combining matrix,
$D^H X(t)$ being a main output of the combining matrix,
$\delta = T_2/(T_1 + T_2)$ is a voltage attenuation coefficient in the output feedback path,
$T_1$ is a time constant of a first single pole RC lowpass filter, $T_1 > 2$ N/B when B is defined above and N is the number of the first plurality of said sensor elements;

$T_2$ is a time-constant of a second single-pole RC low-pass filter which governs overall convergence of the weight-controlling signals, $T_2 \gg T_1$, $-g$ is negative DC gain of each loop, and G is feedback gain of each loop.

37. The signal processor as defined in claim 35 which produces signal W(t) which controls adaptively the weighting circuits according to the following equation:

$$W(t) - W(0) = (1 - e^{-t/T_2})(W_{opt} - W(0))$$

where

W(0) is an initial condition weight vector, $W_{opt} = [I(1/gG) + C^H RC]^{-1} C^H RD$ is an optimal steady-state weight-vector where $R = X(t)X^H(t)$.

* * * * *